(12) United States Patent  
Okada

(10) Patent No.: US 11,038,488 B2  
(45) Date of Patent: Jun. 15, 2021

(54) MULTIPLEXER

(71) Applicant: Murata Manufacturing Co., Ltd., Nagaokakyo (JP)

(72) Inventor: Shinichi Okada, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 58 days.

(21) Appl. No.: 16/435,665

(22) Filed: Jun. 10, 2019

(65) Prior Publication Data

US 2019/0393862 A1 Dec. 26, 2019

(30) Foreign Application Priority Data

Jun. 21, 2018 (JP) .............................. JP2018-117906

(51) Int. Cl.

| H03H 9/54 | (2006.01) |
|---|---|
| H03H 9/72 | (2006.01) |
| H03H 9/64 | (2006.01) |
| H03H 9/70 | (2006.01) |
| H03H 9/60 | (2006.01) |
| H03H 9/145 | (2006.01) |

(Continued)

(52) U.S. Cl.

CPC ........ H03H 9/542 (2013.01); H03H 9/14544 (2013.01); H03H 9/177 (2013.01); H03H 9/605 (2013.01); H03H 9/6483 (2013.01); H03H 9/703 (2013.01); H03H 9/72 (2013.01); H01Q 23/00 (2013.01)

(58) Field of Classification Search

CPC ........ H03H 9/72; H03H 9/542; H03H 9/6483; H03H 9/703; H03H 9/605; H03H 9/14544; H03H 9/177; H03H 9/725; H03H 9/64; H01Q 23/00; H04B 1/50

USPC ......................................................... 333/133

See application file for complete search history.

(56) References Cited

U.S. PATENT DOCUMENTS 9,356,576 B2 * 5/2016 Okuda ................ H03H 9/0576  
2006/0055485 A1 3/2006 Lobeek (Continued)

FOREIGN PATENT DOCUMENTS

JP 2010-045563 A 2/2010  
JP 2016-082523 A 5/2016

(Continued)

OTHER PUBLICATIONS

Official Communication issued in corresponding Korean Patent Application No. 10-2019-0060538, dated Aug. 18, 2020.

(Continued)

*Primary Examiner* — Robert J Pascal  
*Assistant Examiner* — Jorge L Salazar, Jr.  
(74) *Attorney, Agent, or Firm* — Keating & Bennett, LLP

(57) ABSTRACT

A multiplexer includes first and second nodes, an inductor, a first transmit/receive filter, and second and third transmit filters. The inductor is connected at one end to the first node and at the other end to the second node. The first transmit/receive filter is connected to the first node without the inductor interposed therebetween and uses the transmit and receive bands of band A as a pass band. The second transmit filter is connected to the second node and uses the transmit band of band B as a pass band. The third transmit filter is connected to the second node and uses the transmit band of band C as a pass band.

20 Claims, 16 Drawing Sheets

(51) Int. Cl.
H03H 9/17 (2006.01)
H01Q 23/00 (2006.01)

(56) References Cited

U.S. PATENT DOCUMENTS

| | | | | |
|---|---|---|---|---|
| 2010/0007435 | A1* | 1/2010 | Kawamoto | H03H 9/02952 |
| | | | | 333/133 |
| 2012/0274417 | A1* | 11/2012 | Kihara | H04B 1/0057 |
| | | | | 333/133 |
| 2013/0285768 | A1* | 10/2013 | Watanabe | H03H 3/02 |
| | | | | 333/193 |
| 2016/0112025 | A1 | 4/2016 | Nishimura | |
| 2018/0109243 | A1 | 4/2018 | Takamine | |

FOREIGN PATENT DOCUMENTS

| | | |
|---|---|---|
| KR | 10-2005-0075433 A | 7/2005 |
| KR | 10-2017-0138953 A | 12/2017 |
| KR | 10-2018-0003626 A | 1/2018 |
| WO | 2016/208670 A1 | 12/2016 |

OTHER PUBLICATIONS

Official Communication issued in corresponding Japanese Patent Application No. 2018-117906, dated Oct. 6, 2020.

* cited by examiner

FIG. 3A
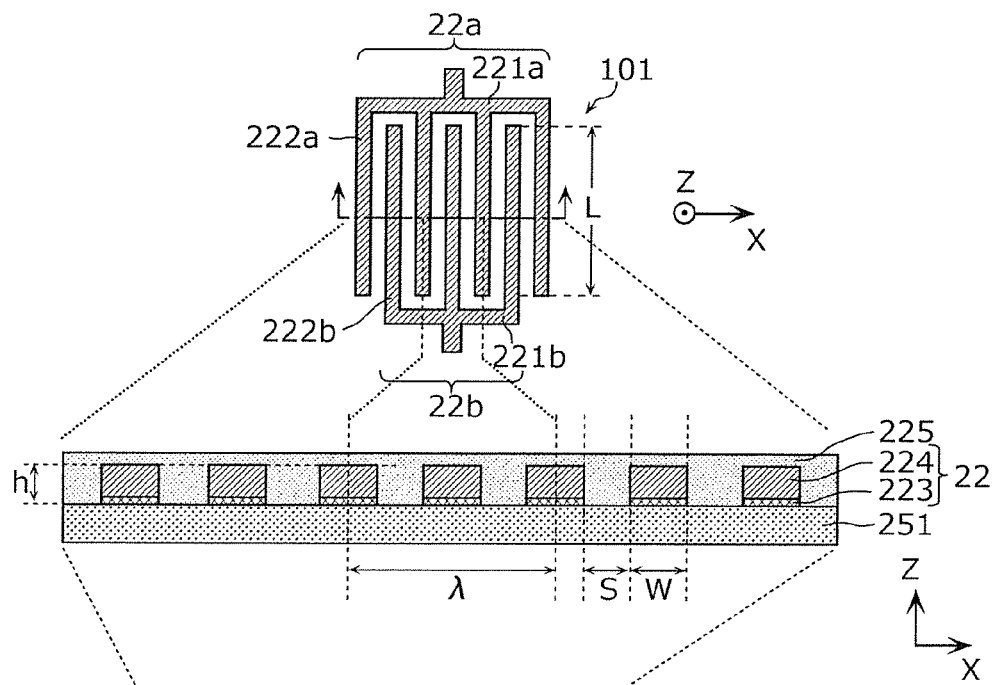
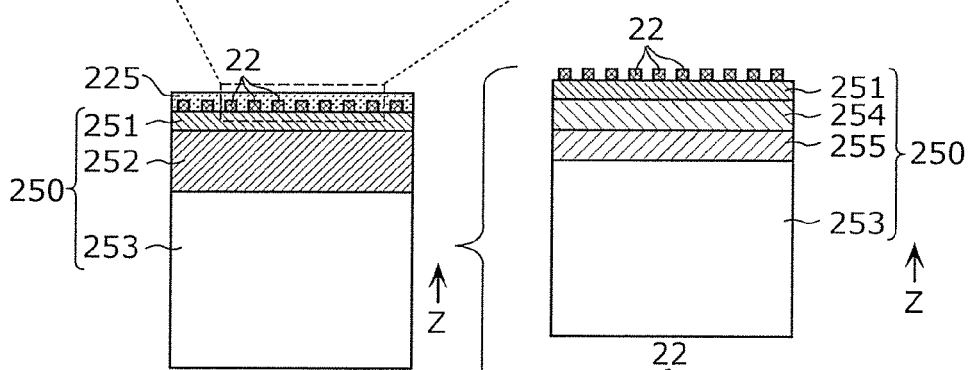
FIG. 3B
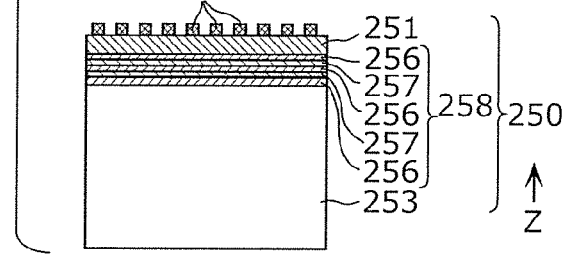
FIG. 3C

FIG. 6A

COMPARATIVE EXAMPLE (a) IMPEDANCE OF FILTER 14 SEEN BY COMMON TERMINAL 100 WITHIN BAND-C-Tx (b) IMPEDANCE OF FILTER 14 SEEN BY COMMON TERMINAL 100 WITHIN BAND A

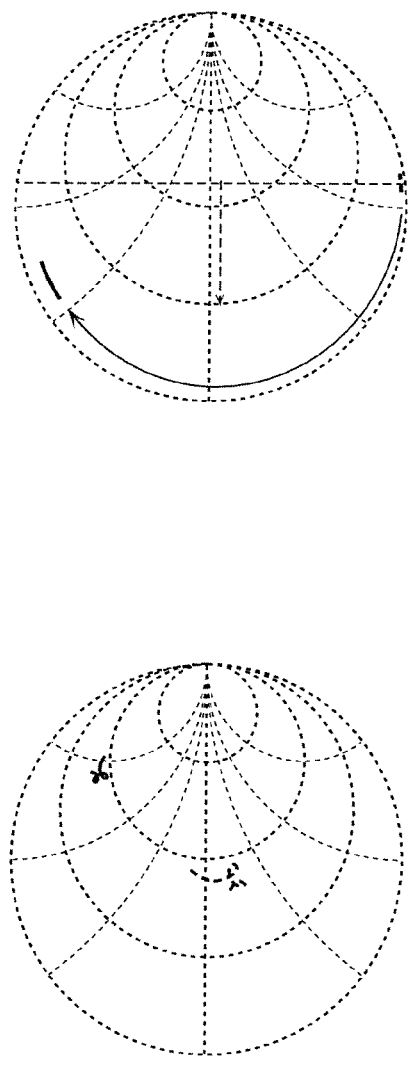

——— : AFTER PHASE SHIFT
------ : BEFORE PHASE SHIFT

IF IMPEDANCE IS SHIFTED AND POSITIONED ON THE LEFT SIDE WITH RESPECT TO INITIAL IMPEDANCE, THE REFLECTION COEFFICIENT IS DECREASED (RETURN LOSS IS INCREASED).

IMPEDANCE OF SINGLE FILTER 14
$Z_0 = Z_a + jZ_b$

IMPEDANCE OF INDUCTOR 520 AND FILTER 14 SEEN BY COMMON TERMINAL
$Z_1 = Z_a + jZ_b + j\omega L$ FIG. 7A   IMPEDANCE IN BAND A
— SINGLE TRANSMIT FILTER 14 (BAND-C-Tx)
⋯⋯ SINGLE RECEIVE FILTER 15 (BAND-C-Rx)
---- SINGLE TRANSMIT FILTER 12 (BAND-B-Tx)
--- SINGLE RECEIVE FILTER 13 (BAND-B-Rx)
— COMBINED CIRCUIT OF FILTERS 12 THROUGH 15 CONNECTED TO NODE n2
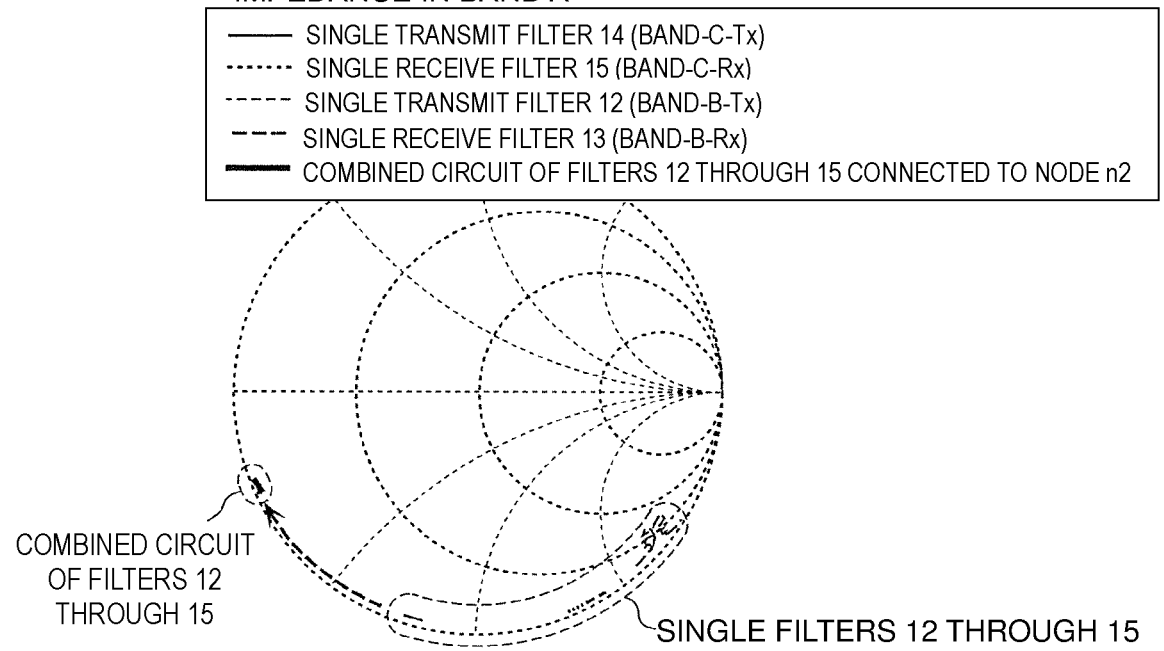
FIG. 7B
---- SINGLE RECEIVE FILTER 13 (BAND-B-Rx)
— COMBINED CIRCUIT OF FILTERS 12 THROUGH 15 CONNECTED TO NODE n2
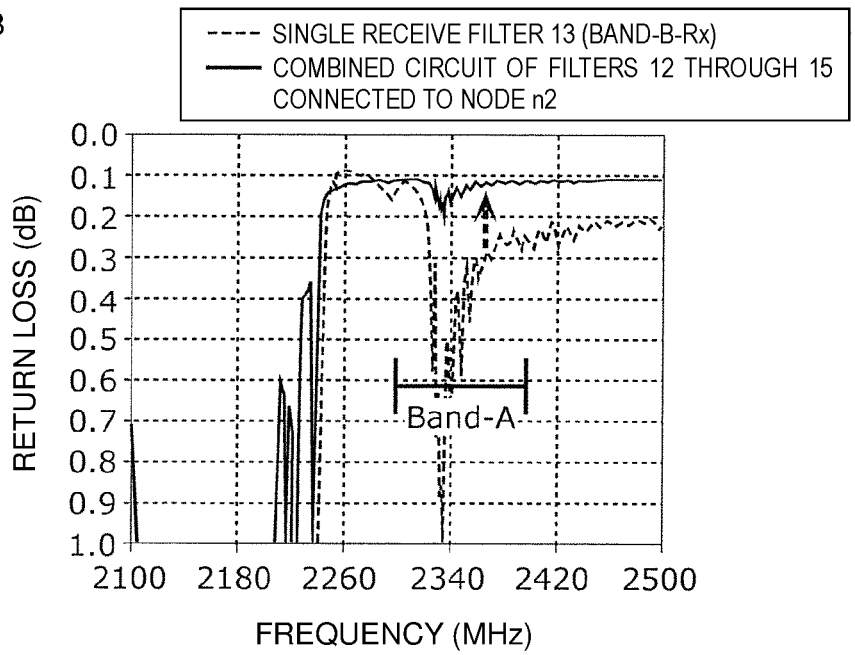

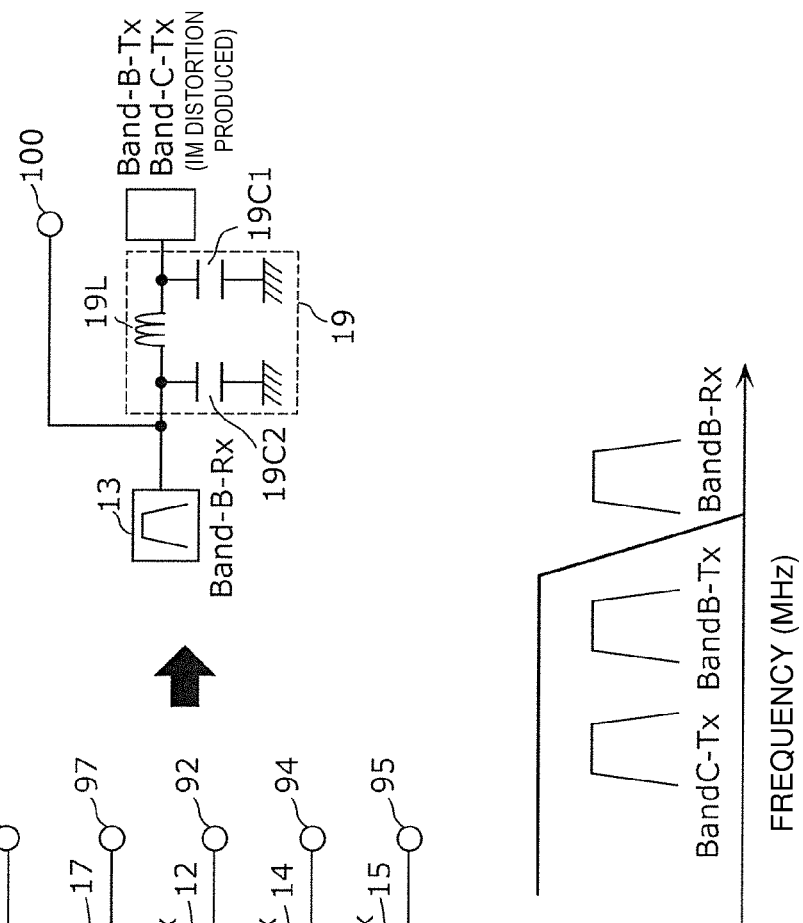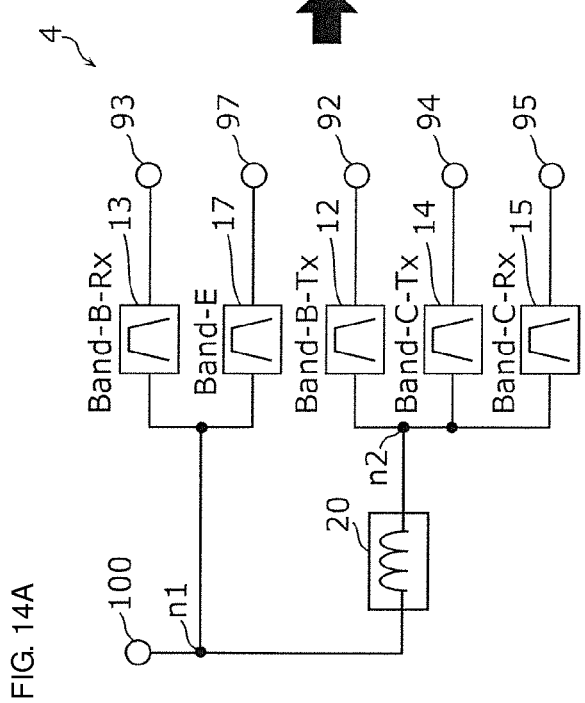

MULTIPLEXER

CROSS REFERENCE TO RELATED APPLICATIONS

This application claims the benefit of priority to Japanese Patent Application No. 2018-117906 filed on Jun. 21, 2018. The entire contents of this application are hereby incorporated herein by reference.

BACKGROUND OF THE INVENTION

1. Field of the Invention

The present invention relates to a multiplexer including acoustic wave filters.

2. Description of the Related Art

There is an increasing demand for multiband- and multimode-support cellular phones. To meet this requirement, a multiplexer is provided immediately under a single antenna to separate radio-frequency (RF) signals of multiple communication bands. As plural filters forming a multiplexer, small-loss and high-attenuation acoustic wave filters are used.

International Publication No. 2016/208670 discloses a multiplexer including plural acoustic wave filters which use different pass bands, a common terminal, and an inductance element. The plural acoustic wave filters include first and second transmit filters and first and second receive filters. In the first receive filter, a parallel arm resonator is connected to the common terminal via the inductance element, while, in each of the second receive filter and the first and second transmit filters, a series arm resonator is connected directly to the common terminal. With this configuration, the impedance of the first receive filter seen by the common terminal and that of a combined circuit of the second receive filter and the first and second transmit filters seen by the common terminal may be expressed by the relationship between a complex number and its complex conjugate. It is thus possible to improve impedance matching between the plural acoustic wave filters and also reduce the loss in the multiplexer.

In the multiplexer disclosed in International Publication No. 2016/208670, as a result of connecting the inductance element in series with the first receive filter, the impedance of the first receive filter seen by the common terminal shifts to the inductive region. Then, the impedance of the first receive filter and that of the other filters directly connected to the common terminal may be expressed by the relationship between a complex number and its complex conjugate.

However, a large inductance value is required to shift the impedance of the first receive filter in the pass band of another filter of the multiplexer to the inductive region using the inductance element. This increases the propagation loss in a path including the first receive filter. A large inductance element is also required, thus increasing the circuit size of the multiplexer.

Additionally, after the impedance of the first receive filter in the pass band of a different filter of the multiplexer is shifted to the inductive region using the inductance element, if the absolute value of the reactance components of the first receive filter in the pass band of the different filter becomes smaller than that of the initial impedance of the first receive filter, the return loss of the first receive filter in the pass band of the different filter is increased. This increases the insertion loss of this different filter.

SUMMARY OF THE INVENTION

Preferred embodiments of the present invention provide small-size multiplexers which are each able to reduce the insertion loss of each of acoustic wave filters connected to a common terminal within its pass band.

A multiplexer according to a preferred embodiment of the present invention includes first and second common connecting terminals, an inductance element, and first through third acoustic wave filters. The inductance element is connected at one end to the first common connecting terminal and at the other end to the second common connecting terminal. The first acoustic wave filter is connected to the first common connecting terminal without the inductance element interposed therebetween and uses a first frequency band as a pass band. The second acoustic wave filter is connected to the second common connecting terminal and uses a second frequency band as a pass band. The third acoustic wave filter is connected to the second common connecting terminal and uses a third frequency band as a pass band.

According to preferred embodiments of the present invention, it is possible to provide small-size multiplexers which are each able to reduce the insertion loss of each of acoustic wave filters connected to a common terminal within its pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A to 3C show plan views and sectional views schematically illustrating an acoustic wave resonator of an acoustic wave filter according to the first preferred embodiment of the present invention.

FIG. 6A shows Smith charts illustrating the impedance of a band-C transmit filter in the comparative example.

FIG. 7A is a Smith chart illustrating the impedance of each of single band-B and band-C filters and the impedance of a combined circuit of these filters seen by a node n2 according to the first preferred embodiment of the present invention.

FIG. 7B is a graph illustrating a comparison between the reflection characteristics of a single band-B receive filter at the node n2 and those of the combined circuit of the band-B and band-C filters according to the first preferred embodiment of the present invention.

FIGS. 14A and 14B are respectively a circuit diagram and an equivalent circuit diagram of a multiplexer according to a modified example of the third preferred embodiment of the present invention.

FIG. 14C is a graph illustrating the bandpass characteristics of the multiplexer according to the modified example of the third preferred embodiment of the present invention.

DETAILED DESCRIPTION OF THE PREFERRED EMBODIMENTS

Figure 1:
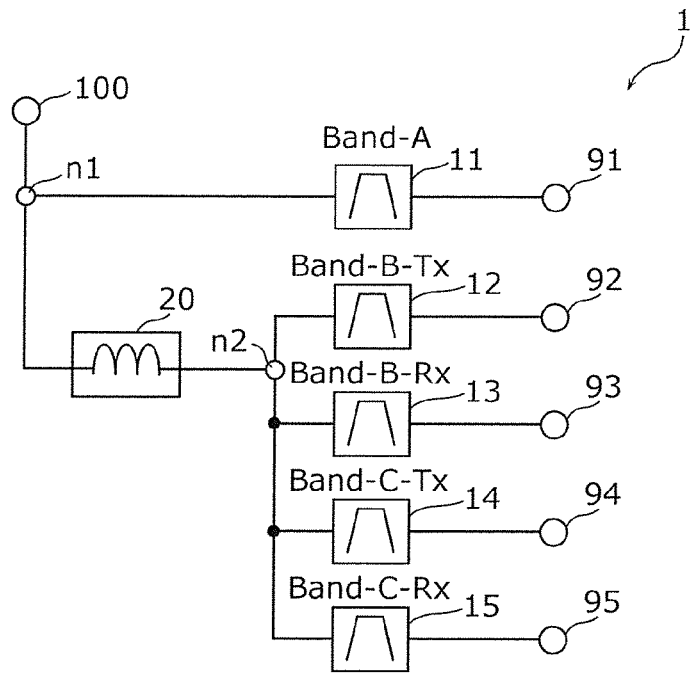
FIG. 1 is a circuit diagram of a multiplexer according to a first preferred embodiment of the present invention.

Preferred embodiments of the present invention will be described below in detail through illustration of examples with reference to the accompanying drawings. All of the preferred embodiments described below illustrate general or specific examples. Numeric values, configurations, materials, components, and positions and connection configurations of the components illustrated in the following preferred embodiments are only examples, and are not described to limit the scope of the present invention. Among the components illustrated in the following preferred embodiments, the components that are not recited in the independent claim will be described as optional components. The sizes and dimensional ratios of the components in the drawings are not necessarily illustrated as actual sizes and ratios.

First Preferred Embodiment

FIG. 1 is a circuit diagram of a multiplexer 1 according to a first preferred embodiment of the present invention. As shown in FIG. 1, the multiplexer 1 includes a transmit/receive filter 11, transmit filters 12 and 14, receive filters 13 and 15, an inductor 20, and a common terminal 100. The multiplexer 1 also includes a node n1 (first common connecting terminal) disposed on a path connecting the common terminal 100 and one end of the inductor 20 and a node n2 (second common connecting terminal) disposed on a path connecting the transmit filters 12 and 14 and the receive filters 13 and 15 and the other end of the inductor 20. The common terminal 100 and the node n1 may be the same terminal, in which case, the common terminal 100 corresponds to the first common connecting terminal.

The common terminal 100 is connected to an antenna device, for example.

The inductor 20 is an inductance element connected at one end to the node n1 and at the other end to the node 2. That is, the inductor 20 is connected in series between the nodes n1 and n2. The inductor 20 may be any one of a chip inductor, a coil pattern provided on a mounting substrate, and a wiring inductance component, for example.

The transmit/receive filter 11 is a first acoustic wave filter using the transmit and receive bands of a communication band A (hereinafter simply called band A) (first frequency band) as the pass band. The transmit/receive filter 11 is connected directly to the node n1 without the inductor 20 interposed therebetween. The transmit/receive filter 11 receives an RF transmit signal generated in a transmit circuit (RF integrated circuit (RFIC), for example) via an input/output terminal 91 and outputs the RF transmit signal to the node n1. The transmit/receive filter 11 also receives an RF received signal input from the common terminal 100 and outputs it to the input/output terminal 91. Switching between an RF transmit signal and an RF received signal on a path including the transmit/receive filter 11 may be performed by a switch circuit (not shown) connected to the input/output terminal 91, for example. As band A, for example, Band 40 (transmit and receive bands: about 2300 MHz to about 2400 MHz) of Long Term Evolution (LTE) is preferably used.

The transmit filter 12 is a second acoustic wave filter using the transmit band of band B (second frequency band) as the pass band. The transmit filter 12 is connected to the node n2. The transmit filter 12 receives an RF transmit signal generated in a transmit circuit (RFIC, for example) via an input/output terminal 92 and outputs the RF transmit signal to the node n2. As the transmit band of band B, for example, LTE Band 1 (transmit band: about 1920 MHz to about 1980 MHz) is preferably used.

The receive filter 13 is a second acoustic wave filter using the receive band of band B (second frequency band) as the pass band. The receive filter 13 is connected to the node n2. The receive filter 13 receives an RF received signal input from the common terminal 100 and outputs it to an input/output terminal 93. As the receive band of band B, for example, LTE Band 1 (receive band: about 2110 MHz to about 2170 MHz) or LTE Band 66 (receive band: about 2110 MHz to about 2200 MHz) is preferably used.

The transmit filter 14 is a third acoustic wave filter using the transmit band of band C (third frequency band) as the pass band. The transmit filter 14 is connected to the node n2. The transmit filter 14 receives an RF transmit signal generated in a transmit circuit (RFIC, for example) via an input/output terminal 94 and outputs the RF transmit signal to the node n2. As the transmit band of band C, for example, LTE Band 3 (transmit band: about 1710 MHz to about 1785 MHz) is preferably used.

The receive filter 15 is a third acoustic wave filter using the receive band of band C (third frequency band) as the pass band. The receive filter 15 is connected to the node n2. The receive filter 15 receives an RF received signal input from the common terminal 100 and outputs it to an input/output terminal 95. As the receive band of band C, for example, LTE Band 3 (receive band: about 1805 MHz to about 1880 MHz) is preferably used.

In the multiplexer 1 according to the first preferred embodiment, the first acoustic wave filter connected to the node n1 without the inductor 20 interposed therebetween is not limited to a transmit/receive filter and may be any one of a transmit filter or a receive filter. The first acoustic wave filter is not limited to a single filter, and two or more first acoustic wave filters may be provided. Each of the transmit filters 12 and 14 and the receive filters 13 and 15 may be any one of a transmit filter, a receive filter, and a transmit/receive filter. Although four acoustic wave filters are connected directly to the node n2 in FIG. 1, it is sufficient for two or more acoustic wave filters to be connected directly to the node n2.

The transmit/receive filter 11, the transmit filters 12 and 14, and the receive filters 13 and 15 are preferably acoustic wave filters and typically have capacitive impedance. In the multiplexer 1 configured as described above, in contrast to the capacitive transmit/receive filter 11 which is not connected to the other end of the inductor 20, the impedance of a combined (parallel) circuit of the transmit filters 12 and 14 and the receive filters 13 and 15 connected to the node n2 seen by the node n1 becomes inductive by providing the inductor 20. With this configuration, the impedance of the transmit/receive filter 11 seen by the node n1 and that of the above-described combined circuit seen by the node n1 may be expressed by the relationship between a complex number and its complex conjugate (hereinafter such a relationship will be called a complex-number conjugate relationship). This is able to improve impedance matching between the acoustic wave filters of the multiplexer 1. As a result, a small-loss multiplexer 1 is able to be provided.

The configuration of the first preferred embodiment in which two or more acoustic wave filters are connected in parallel with each other to the inductor 20 will be compared with a comparative example. In the comparative example, only one acoustic wave filter is connected to an inductor which is used to shift the impedance of the acoustic wave filter to the inductive impedance. The reactance value of the combined circuit of the configuration of the first preferred embodiment is smaller than that of the acoustic wave filter in the comparative example. Accordingly, a smaller inductance is able to be set for the inductor 20 to shift the impedance of the combined circuit to the inductive region. This reduces the propagation loss caused by the inductor 20 connected in series with the combined circuit and also decreases the size of the multiplexer 1.

The impedance of the combined circuit shifts clockwise on a constant conductance circle of an admittance chart from the impedance of each of the single transmit filters 12 and 14 and the receive filters 13 and 15. Accordingly, the impedance of the combined circuit is located in a lower impedance region having a smaller reactance value within the capacitive region than the impedance of the single acoustic wave filter of the comparative example. The impedance of the combined circuit shifts clockwise on a constant resistance circle from the capacitive region by the provision of the inductor 20 and is located farther outward in a Smith chart. This reduces the return loss (increases the reflection coefficient) corresponding to the impedance of the combined circuit seen by the node n1 in the pass band (band A) of the transmit/receive filter 11. As a result, the insertion loss of the transmit/receive filter 11 is able to be reduced.

According to the first preferred embodiment, it is possible to provide a small-size and small-loss multiplexer 1.

The circuit configuration of each acoustic wave filter of the multiplexer 1 and the structure of an acoustic wave resonator of an acoustic wave filter will be discussed below through illustration of examples.

Figure 2A:
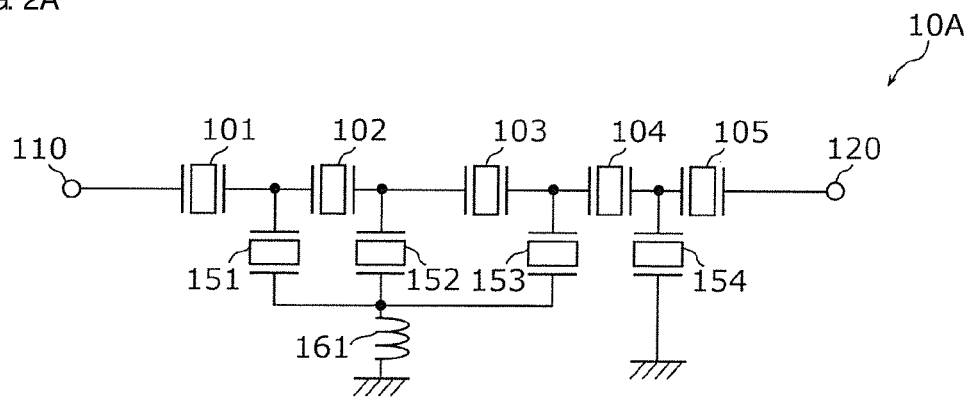
FIG. 2A illustrates a first example of the circuit configuration of an acoustic wave filter of the multiplexer according to the first preferred embodiment of the present invention.
Figure 2B:
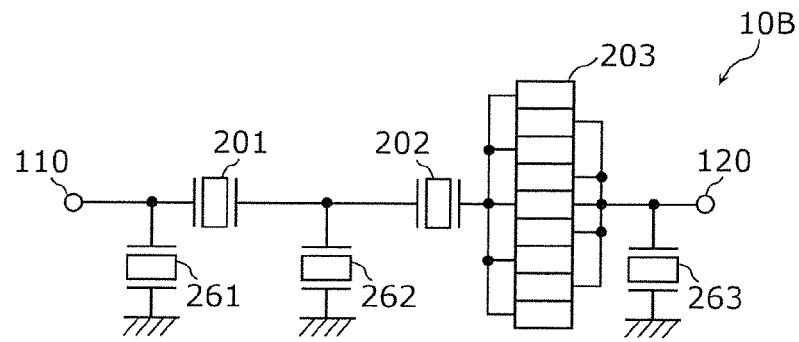
FIG. 2B illustrates a second example of the circuit configuration of an acoustic wave filter of the multiplexer according to the first preferred embodiment of the present invention.

FIG. 2A illustrates a first example of the circuit configuration of each of the acoustic wave filters forming the multiplexer 1 according to the first preferred embodiment. FIG. 2B illustrates a second example of the circuit configuration of each of the acoustic wave filters forming the multiplexer 1 according to the first preferred embodiment.

The transmit/receive filter 11, the transmit filters 12 and 14, and the receive filters 13 and 15 of the multiplexer 1 according to the first preferred embodiment may each have the circuit configuration of an acoustic wave filter 10A shown in FIG. 2A or that of an acoustic wave filter 10B shown in FIG. 2B.

The acoustic wave filter 10A shown in FIG. 2A includes series arm resonators 101 through 105, parallel arm resonators 151 through 154, and an inductor 161.

The series arm resonators 101 through 105 are disposed in series with each other on a path connecting input/output terminals 110 and 120. The parallel arm resonator 151 is connected between a ground and a node between the series arm resonators 101 and 102. The parallel arm resonator 152 is connected between a ground and a node between the series arm resonators 102 and 103. The parallel arm resonator 153 is connected between a ground and a node between the series arm resonators 103 and 104. The parallel arm resonator 154 is connected between a ground and a node between the series arm resonators 104 and 105. With this configuration, the acoustic wave filter 10A defines a ladder band pass filter. The inductor 161 is connected between a ground and a node among the parallel arm resonators 151, 152, and 153, and adjusts the attenuation pole, which is a portion of the filter bandpass characteristics. If the acoustic wave filter 10A is used for one of the transmit/receive filter 11, the transmit filters 12 and 14, and the receive filters 13 and 15, the input/output terminal 110 is connected to a corresponding one of the node n1 and the node n2. In the acoustic wave filter 10A described as the first example of an acoustic wave filter of the multiplexer 1, any numbers of series arm resonators and parallel arm resonators may be provided, and the inductor 161 may be omitted.

The acoustic wave filter 10B shown in FIG. 2B includes a longitudinally coupled filter 203, series arm resonators 201 and 202, and parallel arm resonators 261 through 263.

The longitudinally coupled filter 203 preferably includes nine interdigital transducers (IDTs), for example, and each IDT includes a pair of IDT electrodes opposing each other. The series arm resonators 201 and 202 and the parallel arm resonators 261 and 262 define a ladder filter. With this configuration, the acoustic wave filter 10B defines a band pass filter. If the acoustic wave filter 10B is used for one of the transmit/receive filter 11, the transmit filters 12 and 14, and the receive filters 13 and 15, the input/output terminal 110 is connected to a corresponding one of the node n1 and the node n2. In the acoustic wave filter 10B described as the second example of an acoustic wave filter of the multiplexer 1, any numbers of series arm resonators and parallel arm resonators may be provided, and also, the longitudinally coupled filter 203 may include any number of IDTs.

FIGS. 3A to 3C are sectional views schematically illustrating an acoustic wave resonator of an acoustic wave filter according to the first preferred embodiment. In FIGS. 3A to 3C, among the plurality of acoustic wave resonators defining the acoustic wave filter 10A shown in FIG. 2A, the schematic structure of the series arm resonator 101 is illustrated in a plan view and sectional views. The series arm resonator 101 shown in FIGS. 3A to 3C is merely provided to explain a typical structure of the plurality of acoustic wave resonators, and the number and the length of electrode fingers of each electrode are not restricted to those shown in FIGS. 3A to 3C.

The series arm resonator 101 includes a substrate 250 having piezoelectricity and an IDT electrode 22 including a pair of IDT electrodes 22a and 22b opposing each other. As shown in the plan view of FIGS. 3A to 3C, the pair of opposing IDT electrodes 22a and 22b are provided on the substrate 250. The IDT electrode 22a includes a plurality of electrode fingers 222a disposed in parallel or substantially in parallel with each other and a busbar electrode 221a which connects the electrode fingers 222a. The IDT electrode 22b includes a plurality of electrode fingers 222b disposed in parallel or substantially in parallel with each other and a busbar electrode 221b which connects the electrode fingers 222b. The plurality of electrode fingers 222a and 222b are arranged in a direction perpendicular or substantially perpendicular to the X-axis direction.

The IDT electrode 22 including the plurality of electrode fingers 222a and 222b and the busbar electrodes 221a and 221b preferably has, for example, a multilayer structure including a contact layer 223 and a main electrode layer 224, as shown in the sectional view in the upper section of FIGS. 3A to 3C.

The contact layer 223 improves the adhesiveness between the substrate 250 and the main electrode layer 224. As the material for the contact layer 223, Ti, for example, is preferably used. The film thickness of the contact layer 223 is preferably about 12 nm, for example.

As the material for the main electrode layer 224, Al with about 1% Cu content, for example, is preferably used. The film thickness of the main electrode layer 224 is preferably about 162 nm, for example.

A protection layer 225 covers the IDT electrodes 22a and 22b. The protection layer 225 protects the main electrode layer 224 from external environments, adjusts the frequency-temperature characteristics, and improves the moisture resistance. The protection layer 225 is preferably a film made of silicon dioxide as a main component, for example.

The materials for the contact layer 223, the main electrode layer 224, and the protection layer 225 are not limited to the above-described materials. The IDT electrode 22 is not restricted to the above-described multilayer structure. The IDT electrode 22 may be, for example, made of a metal, such as Ti, Al, Cu, Pt, Au, Ag, or Pd, or an alloy thereof, or may be a multilayer body including multiple layers made of the above-described metals and alloys. The protection layer 225 may be omitted.

The multilayer structure of the substrate 250 will be explained below.

The substrate 250 includes a support substrate 253, an energy trapping layer 252, and a piezoelectric layer 251 stacked on each other in this order in the z-axis direction.

As the piezoelectric layer 251, a $LiTaO_3$ piezoelectric single crystal or piezoelectric ceramics, for example, is preferably used.

The support substrate 253 supports the piezoelectric layer 251, the energy trapping layer 252, and the IDT electrode 22.

The energy trapping layer 252 includes one layer or a plurality of layers. The velocity of acoustic bulk waves propagating through at least one layer defining the energy trapping layer 252 is higher than that of acoustic waves propagating through and in the vicinity of the piezoelectric layer 251. As shown in FIG. 3B, for example, the energy trapping layer 252 preferably has a multilayer structure including a low acoustic velocity layer 254 and a high acoustic velocity layer 255. The acoustic velocity of bulk waves propagating through the low acoustic velocity layer 254 is lower than that of acoustic waves propagating through the piezoelectric layer 251. The acoustic velocity of bulk waves propagating through the high acoustic velocity layer 255 is higher than that of acoustic waves propagating through the piezoelectric layer 251. The support substrate 253 may be defined by a high acoustic velocity layer.

As shown in FIG. 3C, the energy trapping layer 252 is preferably an acoustic impedance layer 258, for example. The acoustic impedance layer 258 is defined by relatively low acoustic impedance layers 256 and relatively high acoustic impedance layers 257 alternately stacked on each other.

With the above-described configuration, the acoustic wave resonator including the substrate 250 having piezoelectricity is likely to exhibit capacitive impedance because the dielectric constant of the piezoelectric layer 251 is high.

Figure 4:
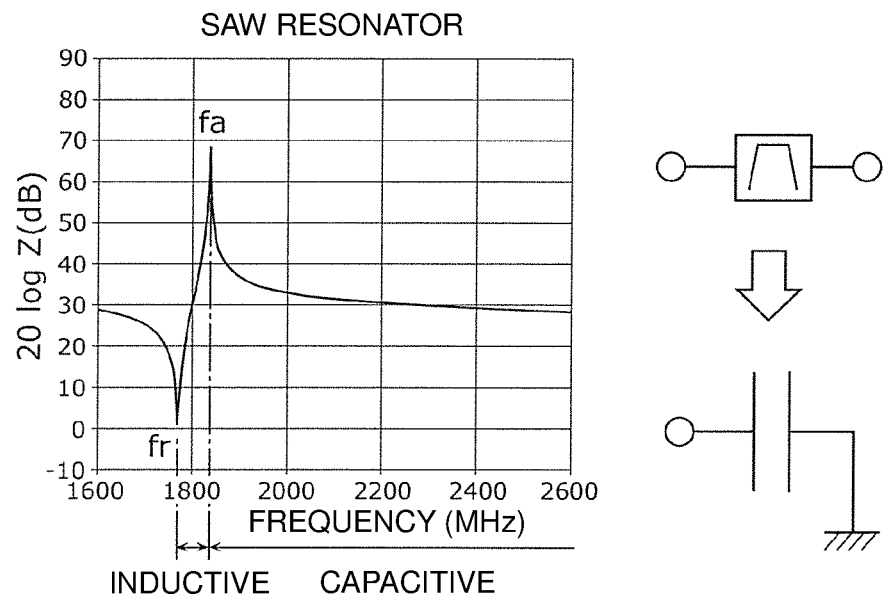
FIG. 4 is a graph illustrating the impedance characteristics of an acoustic wave resonator according to the first preferred embodiment of the present invention.

FIG. 4 is a graph illustrating the impedance characteristics of the acoustic wave resonator according to the first preferred embodiment. As shown in FIG. 4, the impedance of the acoustic wave resonator is minimized at a resonant frequency fr and is maximized at an anti-resonant frequency fa, and thus, becomes capacitive, except for in the frequency band between the resonant frequency fr and the anti-resonant frequency fa.

The operation principle of a ladder surface acoustic wave filter to be used as an acoustic wave filter of the multiplexer 1 according to the first preferred embodiment will be described below. A parallel arm resonator of the ladder acoustic wave filter has a resonant frequency frp and an anti-resonant frequency fap (>frp) and a series arm resonator of the ladder acoustic wave filter has a resonant frequency frs and an anti-resonant frequency fas (>frs>frp). The anti-resonant frequency fap of the parallel arm resonator and the resonant frequency frs of the series arm resonator are caused to approach each other. The impedance of the parallel arm resonator approaches 0 at and around the resonant frequency frp, and a region in and around the resonant frequency frp defines and functions as a lower-frequency elimination band. As the frequency increases, the impedance of the parallel arm resonator becomes higher at and around the anti-resonant frequency fap and the impedance of the series arm resonator approaches 0 at and around the resonant frequency frs. Then, a region between the anti-resonant frequency fap and the resonant frequency frs defines and functions as a signal pass band. As the frequency increases to be even higher, the impedance of the series arm resonator becomes higher at and around the anti-resonant frequency fas, and a region in and around the anti-resonant frequency fas defines and functions as a higher-frequency elimination band.

According to the above-described operation principle, the impedance of the ladder acoustic wave filter becomes capacitive, except in the pass band.

In the circuit configuration of the multiplexer 1 according to the first preferred embodiment, impedance matching between the acoustic wave filters having capacitive impedance is able to be improved, thus making it possible to reduce the loss and the size of the multiplexer 1.

The transmit/receive filter 11, the transmit filters 12 and 14, and the receive filters 13 and 15 of the multiplexer 1 according to the first preferred embodiment are preferably, for example, surface acoustic wave (SAW) resonators having the above-described multilayer structure, for example. However, the acoustic wave filters of the multiplexer 1 are not restricted to SAW devices, and may be bulk acoustic wave (BAW) devices or film bulk acoustic resonators (FBARs), for example. SAWs include, not only surface acoustic waves, but also boundary waves.

Advantages obtained by the multiplexer 1 according to the first preferred embodiment will be described below in detail by comparison with a multiplexer 500 according to a comparative example.

Figure 5:
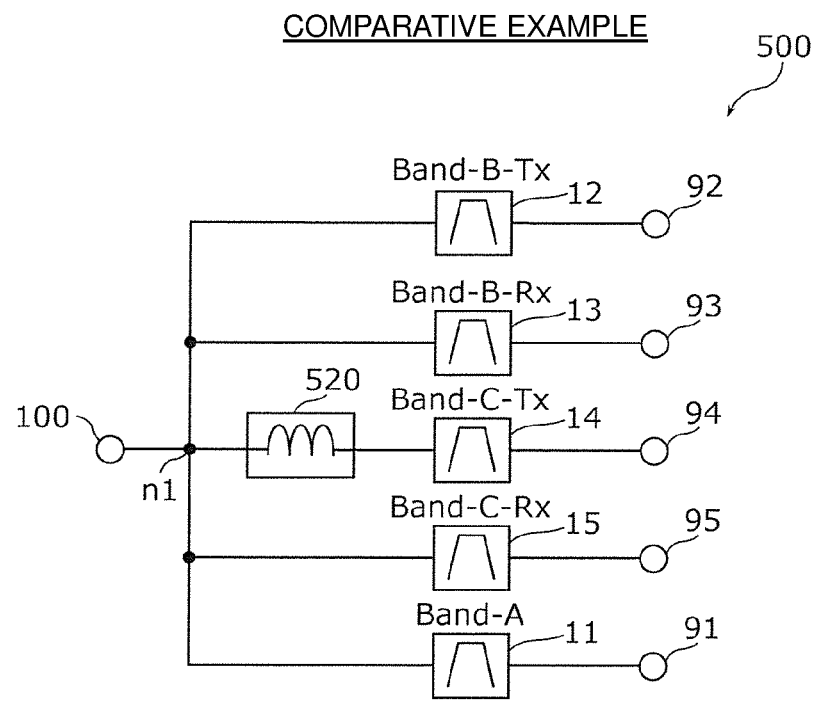
FIG. 5 is a circuit diagram of a multiplexer according to a comparative example.

FIG. 5 is a circuit diagram of the multiplexer 500 according to a comparative example. As shown in FIG. 5, the multiplexer 500 includes a transmit/receive filter 11, transmit filters 12 and 14, receive filters 13 and 15, an inductor 520, and a common terminal 100. In the multiplexer 500, the connection mode of the inductor 520 is different from that of the inductor 520 of the multiplexer 1 according to the first preferred embodiment. The multiplexer 500 of the comparative example will be described below mainly by referring to points different from the multiplexer 1 of the first preferred embodiment.

The inductor 520 is connected at one end to a node n1 and at the other end to the transmit filter 14.

The transmit/receive filter 11 is an acoustic wave filter using the transmit and receive bands of band A as the pass band and is connected directly to the common terminal 100. The transmit filter 12 is an acoustic wave filter using the transmit band of band B as the pass band and is connected directly to the common terminal 100. The receive filter 13 is an acoustic wave filter using the receive band of band B as the pass band and is connected directly to the common terminal 100. The transmit filter 14 is an acoustic wave filter using the transmit band of band C as the pass band and is connected to the other end of the inductor 520. The receive filter 15 is an acoustic wave filter using the receive band of band C as the pass band and is connected directly to the common terminal 100.

In the configuration of the multiplexer 500 according to the comparative example, in contrast to the capacitive transmit/receive filter 11, transmit filter 12, and receive filters 13 and 15 which are not connected to the inductor 520, the impedance of the transmit filter 14 connected to the inductor 520 seen by the node n1 becomes inductive by providing the inductor 520. With this configuration, the impedance of the transmit filter 14 seen by the node n1 and that of a combined (parallel) circuit of the transmit/receive filter 11, the transmit filter 12, and the receive filters 13 and 15 seen by the node n1 may be expressed by a complex-number conjugate relationship.

In the multiplexer 500, only the transmit filter 14 is connected to the inductor 520. The reactance value of the transmit filter 14 is thus greater than that of the combined circuit of the four acoustic wave filters in the multiplexer 1 of the first preferred embodiment. Accordingly, a larger inductance is required for the inductor 520 to shift the impedance of the transmit filter 14 to the inductive region than that for the inductor 20 of the multiplexer 1. This increases the propagation loss in a path including the transmit filter 14 and also increases the size of the multiplexer 500.

FIG. 6A shows Smith charts illustrating the impedance of the transmit filter 14 in the comparative example. Part (a) of FIG. 6A shows the impedance of the transmit filter 14 seen by the common terminal 100 in the transmit band of band C before phase shift is performed by the inductor 520 and that after phase shift is performed by the inductor 520. Part (b) of FIG. 6A shows the impedance of the transmit filter 14 seen by the common terminal 100 in the transmit band of band A before phase shift is performed by the inductor 520 and that after phase shift is performed by the inductor 520. As shown in FIG. 6A, the impedance of the transmit filter 14 connected to the inductor 520 shifts clockwise on a constant resistance circle (imaginary axis) from the capacitive region. Due to this phase shift on the constant resistance circle, as shown in part (b) of FIG. 6A, if the impedance of the transmit filter 14 in band A which has been shifted by the inductor 520 is positioned on the left side with respect to the initial impedance of the transmit filter 14 in band A, it is located farther inward in the Smith chart (the reflection coefficient is decreased). In contrast, if the impedance of the transmit filter 14 in band A is shifted by the inductor 520 so as to be positioned on the right side with respect to the initial impedance of the transmit filter in band A, it is necessary to increase the amount of phase shift. Accordingly, an inductor 520 having a large inductance value is required, thus increasing the propagation loss in a path including the transmit filter 14 and also increasing the size of the multiplexer 500.

It is assumed that the impedance $Z_0$ of the single transmit filter 14 is expressed by equation (1).

$$Z_0 = Z_a + jZ_b \tag{1}$$

It is assumed that the impedance $Z_1$ of the transmit filter 14 after phase shift is performed is expressed by equation (2):

$$Z_1 = Z_a + jZ_b + j\omega L \tag{2}$$

where L is the inductance of the inductor 520.

The condition that the impedance $Z_1$ of the transmit filter 14 is positioned on the left side with respect to the impedance $Z_0$ is expressed by equation (3).

$$|jZ_b| > |jZ_b + j\omega L| \tag{3}$$

That is, if the reactance of the impedance $Z_1$ is smaller than that of the impedance $Z_0$, the impedance in the attenuation band, in particular, is located farther inward in a Smith chart. That is, the reflection coefficient is decreased.

Figure 6B:
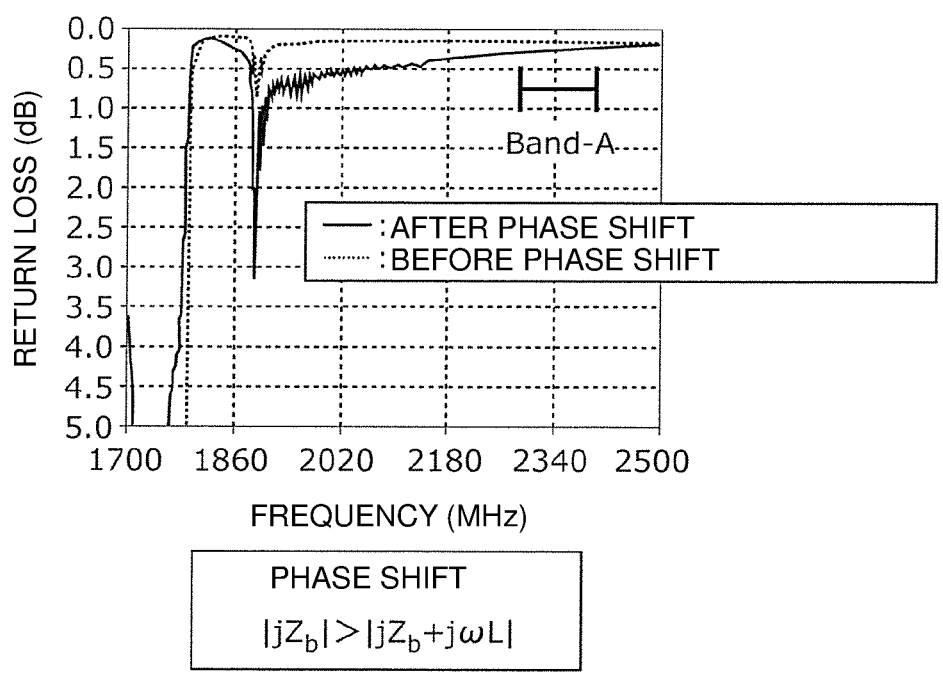
FIG. 6B is a graph illustrating a comparison between the reflection characteristics of the band-C transmit filter in the comparative example before phase shift is performed and those after phase shift is performed.

FIG. 6B is a graph illustrating a comparison between the reflection characteristics of the transmit filter 14 in the comparative example before phase shift is performed and those after phase shift is performed. As shown in FIG. 6B, under the condition represented by equation (3), the return loss of the transmit filter 14 seen by the common terminal 100 which is observed after phase shift is performed is greater than that before phase shift is performed in the entire frequency range. The return loss of the transmit filter 14 in the pass band A of the transmit/receive filter 11 which is not connected to the inductor 520 is also increased.

FIG. 7A is a Smith chart illustrating the impedance of each of the single transmit filters 12 and 14 and the single receive filters 13 and 15 and the impedance of a combined circuit of these filters seen by the node n2 according to the first preferred embodiment. In this combined circuit, capacitance components are added in parallel to the individual acoustic wave filters. The impedance of the combined circuit thus shifts clockwise on a constant conductance circle (imaginary axis) on an admittance chart from the impedance of each acoustic wave filter. Thus, as shown in FIG. 7A, the impedance of the combined circuit seen by the node n2 in band A shifts to and is positioned in the capacitive and lower impedance region than the impedance of each of the transmit filters 12 and 14 and the receive filters 13 and 15 seen by the node n2. The impedance of the combined circuit is thus located farther outward in the Smith chart. That is, the reflection coefficient is increased.

FIG. 7B is a graph illustrating a comparison between the reflection characteristics of the single receive filter 13 at the node n2 and those of the combined circuit according to the first preferred embodiment. As shown in FIG. 7B, the return loss of the combined circuit at the node n2 in band A is smaller than that of the single receive filter 13 in band A.

Figure 7C:
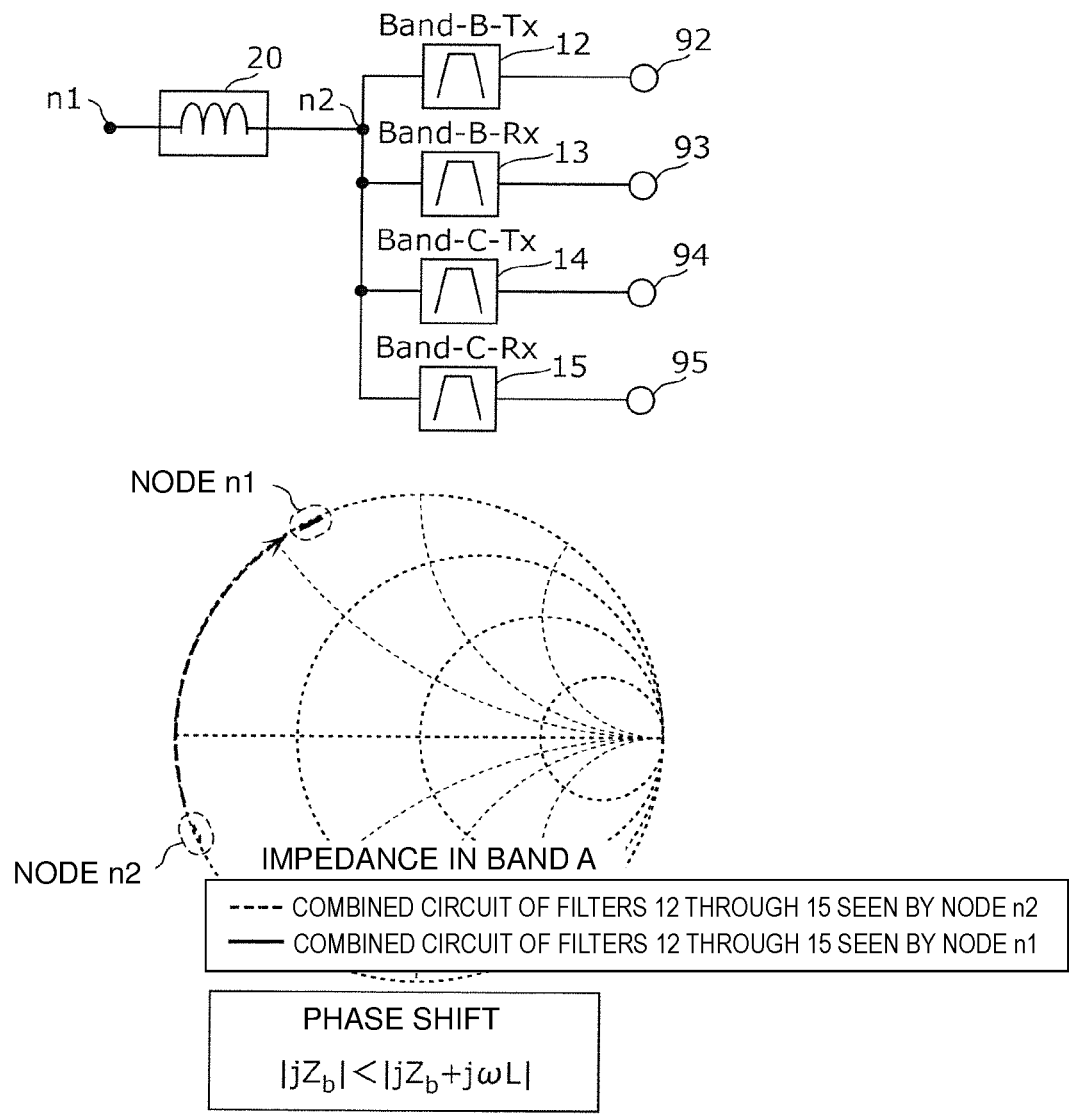
FIG. 7C is a Smith chart illustrating the impedance of the combined circuit of the band-B and band-C filters seen by a node n1 and that seen by the node n2 according to the first preferred embodiment of the present invention.

FIG. 7C is a Smith chart illustrating the impedance of the combined circuit of the transmit filters 12 and 14 and the receive filters 13 and 15 seen by the node n1 and that seen by the node n2 according to the first preferred embodiment. As shown in FIG. 7C, due to the inductor 20, the impedance of the combined circuit seen by the node n1 in band A shifts clockwise on a constant resistance circle (imaginary axis) on the Smith chart from the impedance of the combined circuit seen by the node n2. As shown in FIG. 7A, the impedance of the combined circuit seen by the node n2 in band A shifts to and is positioned in the capacitive and lower impedance region than the impedance of each of the transmit filters 12 and 14 and the receive filters 13 and 15 seen by the node n2. Thus, even with a smaller inductance of the inductor 20, the impedance of the combined circuit seen by the node n1 in band A is able to be located on the right side with respect to the impedance seen by the node n2. That is, equation (4) holds true.

$$|jZ_b| < |jZ_b + j\omega L| \quad (4)$$

That is, the impedance of the combined circuit seen by the node n1 in band A is located in the inductive region and also farther outward in the Smith chart than the impedance seen by the node n2. That is, the reflection coefficient is increased.

Figure 7D:
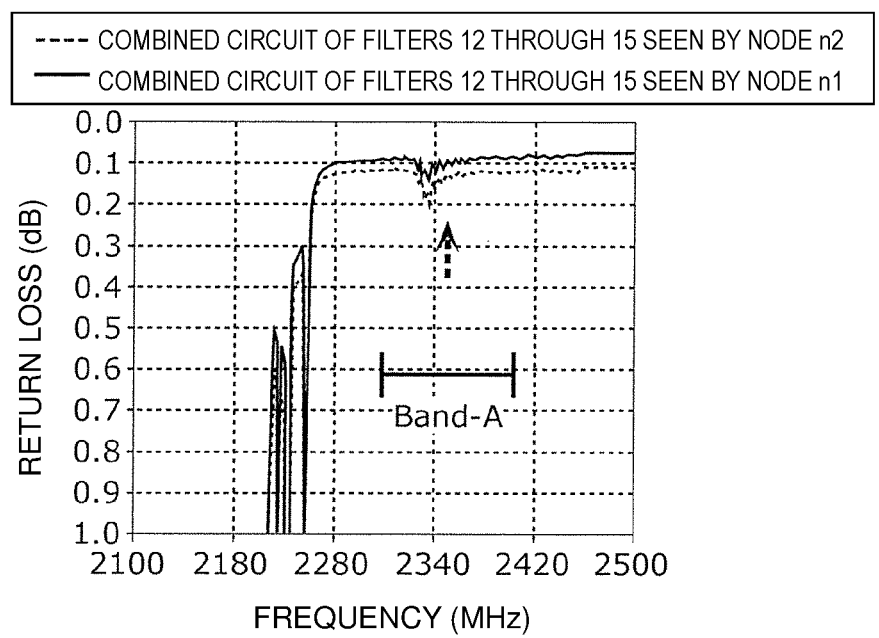
FIG. 7D is a graph illustrating a comparison between the reflection characteristics of the combined circuit of the band-B and band-C filters at the node n1 and those at the node n2 according to the first preferred embodiment of the present invention.

FIG. 7D is a graph illustrating a comparison between the reflection characteristics of the combined circuit at node n1 and those at node n2 according to the first preferred embodiment. As shown in FIG. 7D, the return loss of the combined circuit in band A at the node n1 is smaller than that at the node n2.

Figure 8A:
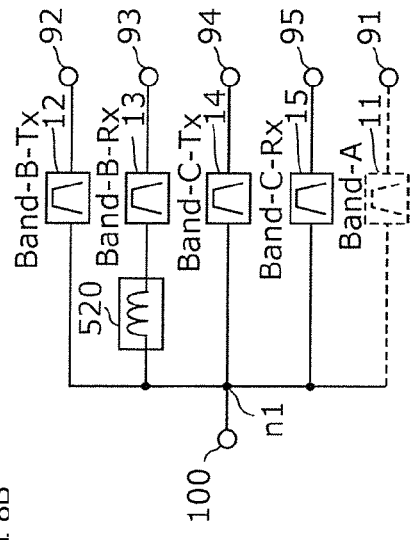
FIGS. 8A to 8C shows a graph illustrating a comparison between the reflection characteristics of the combined circuit of the band-B and band-C filters at the node n1 according to the first preferred embodiment and those of the comparative example, together with the circuit configuration of the first preferred embodiment of the present invention and that of the comparative example.
Figure 8B:
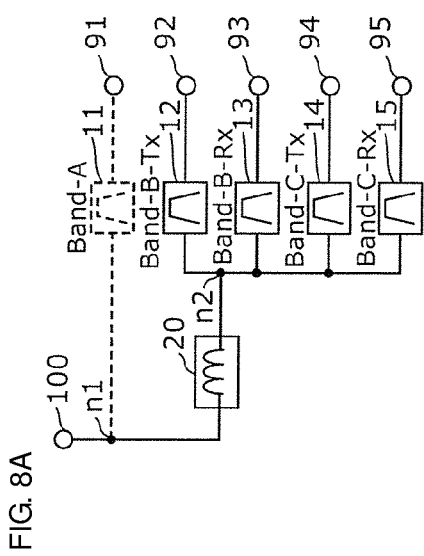
Figure 8C:
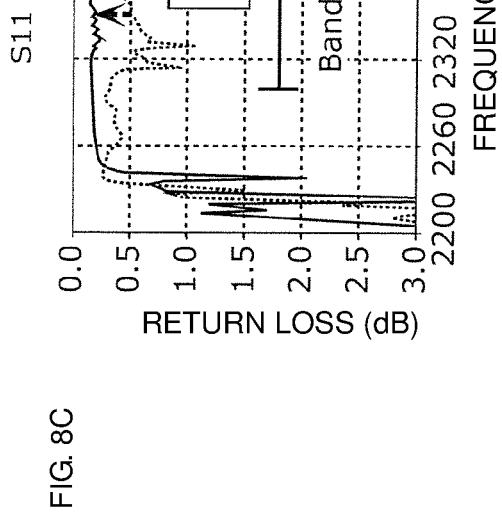

FIGS. 8A to 8C show graphs illustrating a comparison between the reflection characteristics of the combined circuit at node n1 according to the first preferred embodiment and those of the comparative example, together with the circuit configuration of the first preferred embodiment and that of the comparative example. As shown in FIG. 8C, the return loss of the combined circuit corresponding to the impedance seen by the node n1 in band A is smaller in the multiplexer 1 than in the multiplexer 500.

Figure 9A:
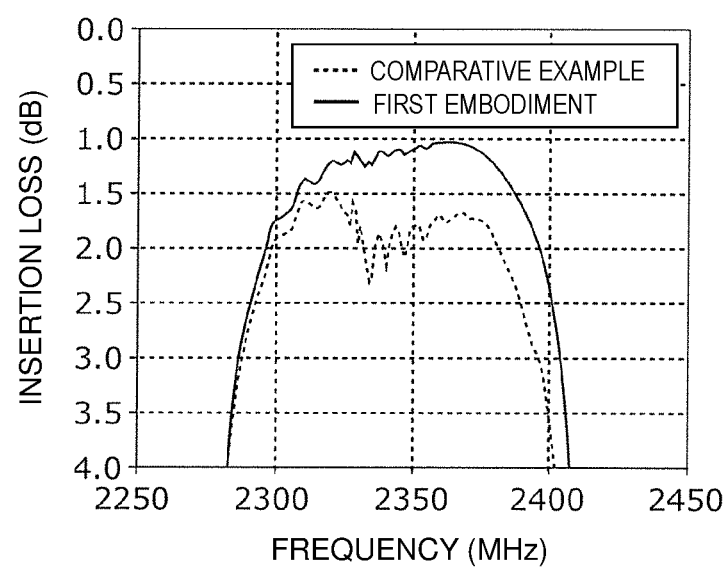
FIG. 9A is a graph illustrating a comparison between the insertion loss of a band-A filter according to the first preferred embodiment of the present invention and that of the comparative example.

FIG. 9A is a graph illustrating a comparison between the bandpass characteristics of the transmit/receive filter 11 according to the first preferred embodiment and those of the comparative example. In the multiplexer 1 of the first preferred embodiment, as shown in FIGS. 8A to 8C, the return loss of the combined circuit in band A is reduced, and thus, the insertion loss of the transmit/receive filter 11 in the pass band is reduced, as shown in FIG. 9A.

Figure 9B:
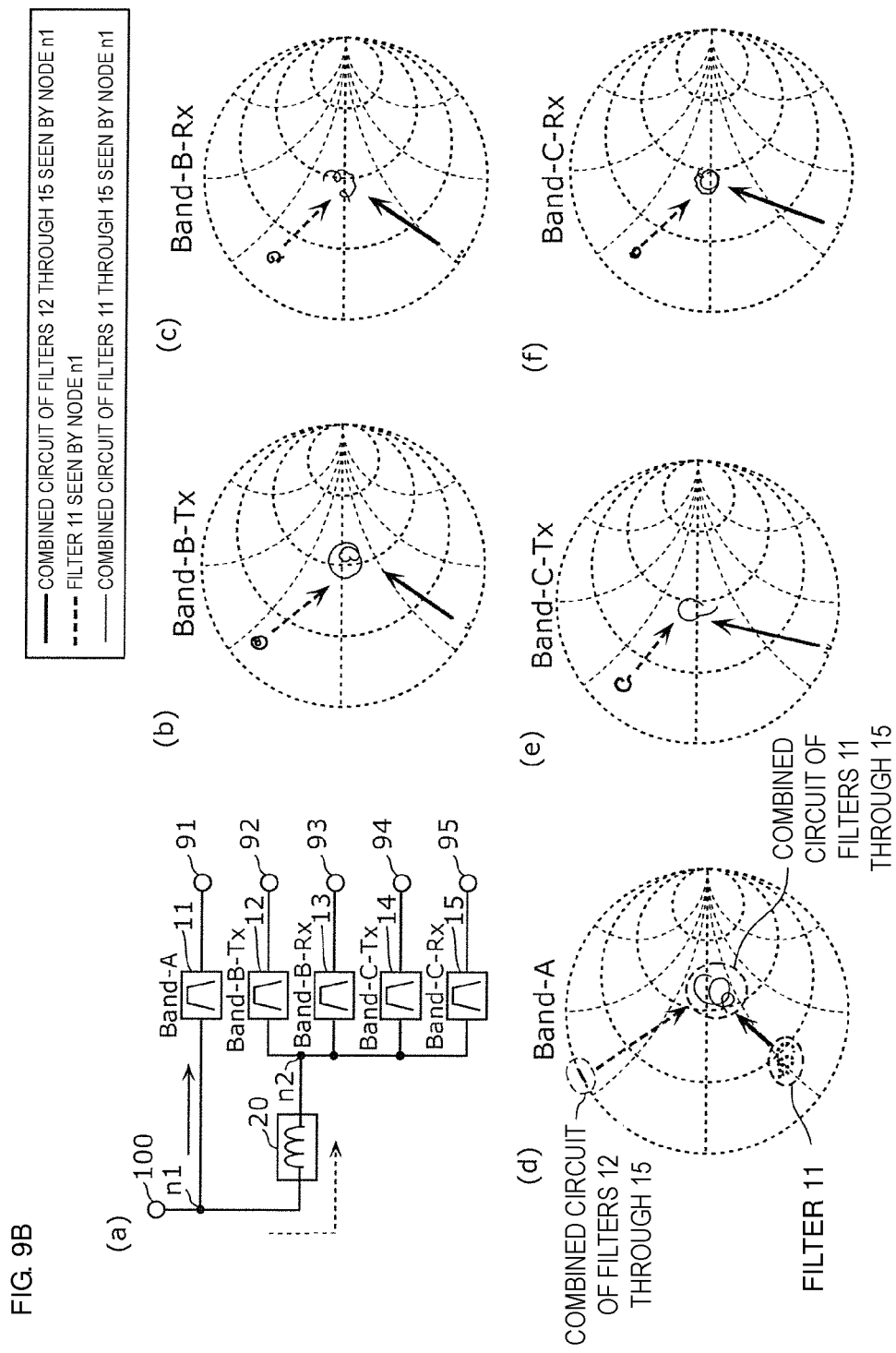
FIG. 9B shows Smith charts illustrating impedance matching implemented by a complex-number conjugate relationship between the band-A filter and the combined circuit of the band-B and band-C filters within the individual bands according to the first preferred embodiment of the present invention.

FIG. 9B shows Smith charts illustrating impedance matching implemented by a complex-number conjugate relationship between the transmit/receive filter 11 and the combined circuit in the individual bands according to the first preferred embodiment. As shown in part (a) of FIG. 9B, in the multiplexer 1 of the first preferred embodiment, the impedance of the transmit/receive filter 11, which is not connected to the inductor 20, seen by the node n1 and that of the combined circuit of the transmit filters 12 and 14 and the receive filters 13 and 15 connected to the inductor 20 seen by the node n1 are expressed by a complex-number conjugate relationship. This configuration improves impedance matching between the acoustic wave filters forming the multiplexer 1 and accordingly reduce the loss in the multiplexer 1. Part (b) of FIG. 9B through part (f) of FIG. 9B show a complex-number conjugate relationship between the impedance of the transmit/receive filter 11 seen by the node n1 and that of the combined circuit seen by the node n1 in the individual bands. More specifically, part (b) of FIG. 9B shows a complex-number conjugate relationship in the transmit band of band B; Part (c) of FIG. 9B shows a complex-number conjugate relationship in the receive band of band B; part (d) of FIG. 9B shows a complex-number conjugate relationship in band A; part (e) of FIG. 9B shows a complex-number conjugate relationship in the transmit band of band C; and part (f) of FIG. 9B shows a complex-number conjugate relationship in the receive band of band C. In each of the pass bands, the combined impedance obtained by the above-described complex-number conjugate relationship matches the reference impedance (about 50Ω, for example). This reduces the insertion loss in each pass band and, accordingly, decreases the loss in the multiplexer 1.

In the multiplexer 1 according to the first preferred embodiment, the frequency range of the pass band of the acoustic wave filter (transmit/receive filter 11) which is not connected to the other end of the inductor 20 may be higher than the frequency ranges of the pass bands of the acoustic wave filters connected to the other end of the inductor 20.

The amount of phase shift by the inductor 20 (inductance L) for the above-described combined (parallel) circuit at a predetermined angular frequency ω is represented by jωL. The amount of phase shift in the attenuation band (band A: angular frequency $\omega_A$) of the combined circuit is accordingly represented by $j\omega_A L$. The inductance L is able to be decreased because the angular frequency $\omega_A$ is large. This contributes to reducing the loss and the size of the multiplexer 1.

In response to a demand to support High Power User Equipment (HPUE), Third Generation Partnership Project (3GPP) specifies that signal power (about 26 dBm, for example) in LTE time-division duplexing (TDD) bands output from an antenna terminal of a cellular phone, for example, is required to be higher than transmit power (about 23 dBm, for example) of LTE frequency-division duplexing (FDD) bands by about 3 dB so that one base station is able to cover a wide area.

Among the TDD bands, for higher-frequency communication bands, such as LTE Band 40 and Band 41, higher attenuation characteristics around a pass band are needed. For this reason, the insertion loss of filters using these bands as the pass band tends to be greater than that of filters using the other bands.

From this point of view, as well, if the multiplexer 1 of the first preferred embodiment is used as an HPUE-support system, Band 40 or Band 41, which is required to achieve a small loss, is preferably used for the acoustic wave filter (transmit/receive filter 11) which is not connected to the other end of the inductor 20. Then, a small-size, small-loss, and HPUE-support multiplexer 1 is able to be provided.

Figure 10:
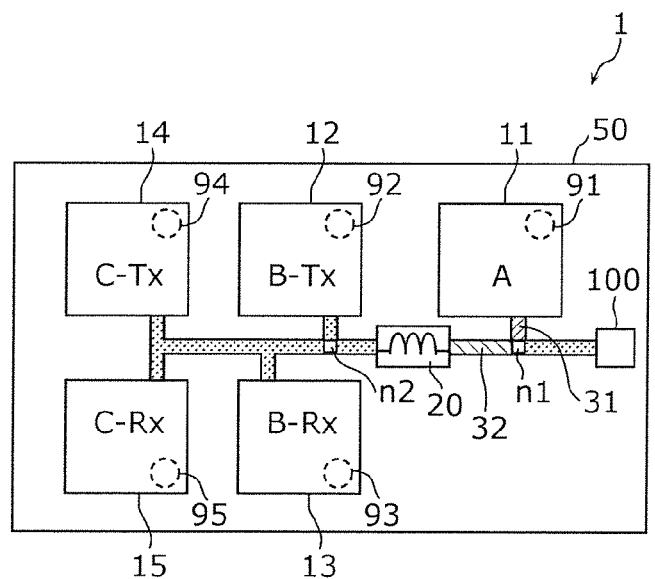
FIG. 10 is a schematic diagram illustrating the arrangement of circuit elements defining the multiplexer according to the first preferred embodiment of the present invention.

FIG. 10 is a schematic diagram illustrating the arrangement of circuit elements of the multiplexer 1 according to the first preferred embodiment. As shown in FIG. 10, the transmit/receive filter 11, the transmit filters 12 and 14, and the receive filters 13 and 15 are mounted on a mounting substrate 50. The common terminal 100 and the individual acoustic wave filters are connected to each other via wiring provided on the mounting substrate 50.

Wiring 31 which connects the node n1 and the transmit/receive filter 11 is preferably shorter than wiring 32 which connects the node n1 and the inductor 20.

Decreasing the length of the wiring 31 reduces or minimizes the possibility that the impedance of the transmit/receive filter 11, which is not connected to the other end of the inductor 20, will shift due to unwanted inductance, such as the parasitic inductance of wiring. It is thus possible that the impedance of the transmit/receive filter 11 seen by the node n1 and that of the combined circuit seen by the node n1 have a higher-precision complex-number conjugate relationship.

The circuit configuration of a multiplexer of a modified example of the first preferred embodiment is the same or substantially the same as that of the multiplexer 1 shown in FIG. 1. In the multiplexer of the modified example, however, the circuit configuration of each acoustic wave filter is specified. The multiplexer of the modified example will be described below mainly by referring to points different from the multiplexer 1 of the first preferred embodiment.

Figure 11A:
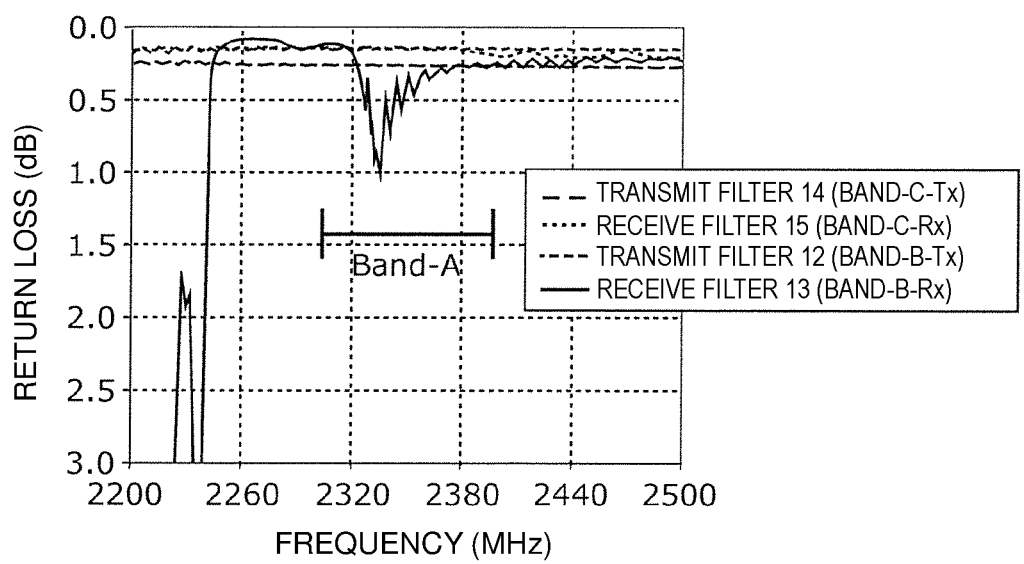
FIG. 11A is a graph illustrating the reflection characteristics of each of acoustic wave filters of a multiplexer within band A according to a modified example of the first preferred embodiment of the present invention.

FIG. 11A is a graph illustrating the reflection characteristics of each of the acoustic wave filters of the multiplexer in band A according to the modified example of the first preferred embodiment. As shown in FIG. 11A, among the transmit filters 12 and 14 and the receive filters 13 and 15 connected to the other end of the inductor 20, the return loss of the receive filter 13 (second acoustic wave filter) in band A is greater than that of the other acoustic wave filters.

Figure 11B:
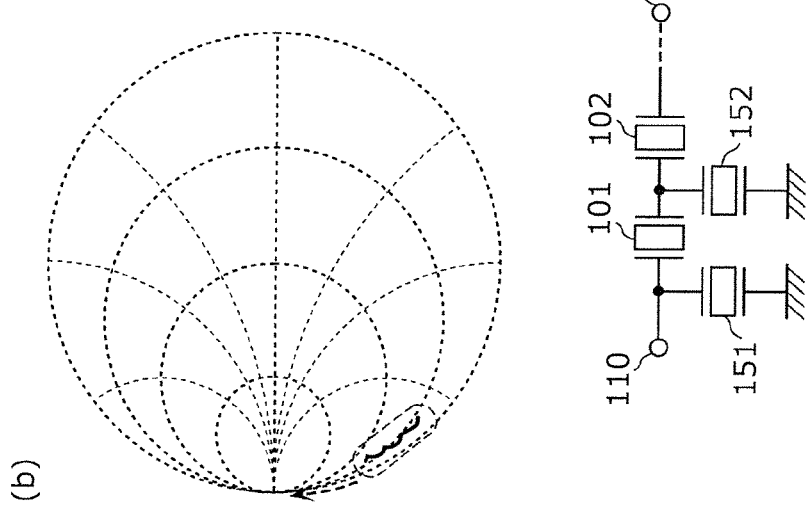
FIG. 11B shows admittance charts for explaining a difference in the impedance depending on the structure of a ladder filter.
Figure 11B:
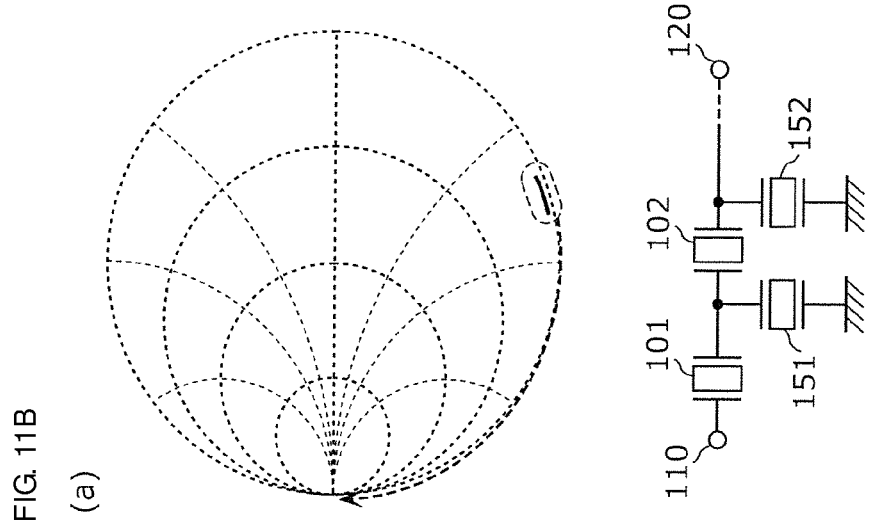

FIG. 11B shows admittance charts for explaining a difference in the impedance depending on the structure of a ladder filter. Part (a) of FIG. 11B shows the impedance of a ladder acoustic wave filter (will be described as an acoustic wave filter A) seen by the input/output terminal 110 in band A. In the acoustic wave filter A, the acoustic wave resonator which is most closely connected to the input/output terminal 110 is the series arm resonator 101. Part (b) of FIG. 11B shows the impedance of a ladder acoustic wave filter (will be described as an acoustic wave filter B) seen by the input/output terminal 110 in band A. In the acoustic wave filter B, the acoustic wave resonator which is most closely connected to the input/output terminal 110 is the parallel arm resonator 151. The acoustic wave filter A or B is connected to the node n2 together with the other acoustic wave filters so as to define a combined circuit. The impedance of the combined circuit shifts clockwise on a constant conductance circuit to a low impedance region from the impedance of the single acoustic wave filter A or B. As the impedance of the combined circuit shifts by a greater amount, it is located farther outward in the admittance chart, thus further reducing the return loss. From this point of view, in the multiplexer of this modified example, the circuit configuration of the acoustic wave filter A is used for the receive filter 13 having the largest return loss in band A. That is, among the acoustic wave resonators of the receive filter 13, the node n2 (second common connecting terminal) is connected to the series arm resonator 101.

The impedance of the receive filter 13 (second acoustic wave filter) having the configuration of the acoustic wave filter A seen by the node n2 is capacitive and also has a large reactance value. As a result of connecting the receive filter 13 in parallel with other acoustic wave filters, the impedance of the combined circuit in band A shifts to a lower impedance region by a greater amount. The impedance of the combined circuit in band A is thus able to be located farther outward in a Smith chart, thus further reducing the return loss in band A. The insertion loss of the transmit/receive filter 11 (first acoustic wave filter) is accordingly able to be reduced.

In the above-described modified example, among the transmit filters 12 and 14 and the receive filters 13 and 15 connected to the node n2, only the receive filter 13 has the configuration of the acoustic wave filter A. However, the transmit filters 12 and 14 and the receive filter 15 may also have the configuration of the acoustic wave filter A.

With this configuration, the impedance of each of the transmit filters 12 and 14 and the receive filters 13 and 15 seen by the node n2 becomes capacitive and also has a large reactance value. Thus, the impedance of the combined circuit of these filters in band A shifts to a lower impedance region by a greater amount. The impedance of the combined circuit in band A is thus able to be located farther outward in a Smith chart, thus further reducing the return loss in band A. The insertion loss of the transmit/receive filter 11 (first acoustic wave filter) is accordingly able to be reduced.

Second Preferred Embodiment

In the multiplexer 1 of the first preferred embodiment, only one filter is connected to the node n1 without an inductance element interposed therebetween. In a multiplexer 2 according to a second preferred embodiment of the present invention, a plurality of acoustic wave filters are connected to the node n1 without an inductance element interposed therebetween.

Figure 12:
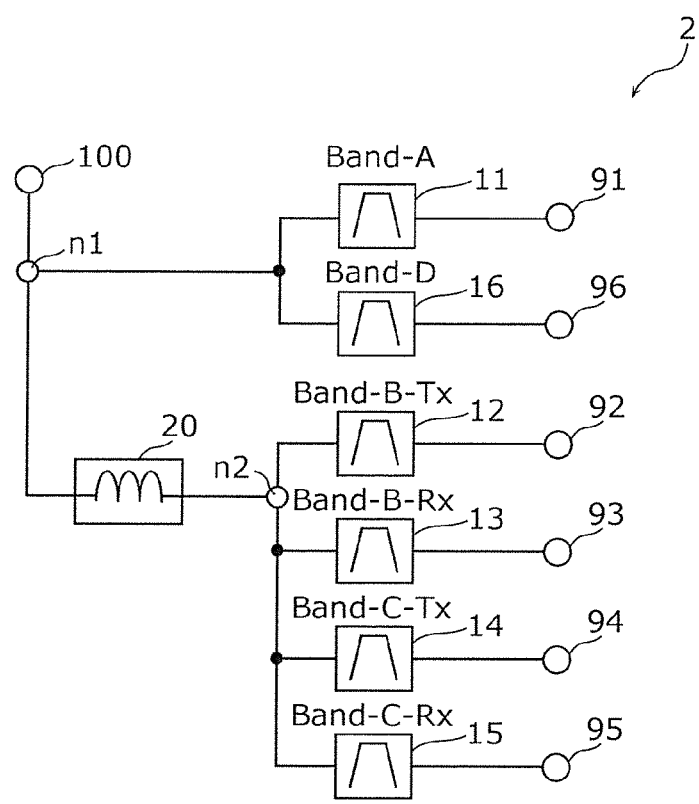
FIG. 12 is a circuit diagram of a multiplexer according to a second preferred embodiment of the present invention.

FIG. 12 is a circuit diagram of the multiplexer 2 according to the second preferred embodiment. As shown in FIG. 12, the multiplexer 2 includes transmit/receive filters 11 and 16, transmit filters 12 and 14, receive filters 13 and 15, an inductor 20, and a common terminal 100. The multiplexer 2 also includes a node n1 (first common connecting terminal) disposed on a path connecting the common terminal 100 and one end of the inductor 20 and a node n2 (second common connecting terminal) disposed on a path connecting the transmit filters 12 and 14 and the receive filters 13 and 15 and the other end of the inductor 20. The common terminal 100 and the node n1 may be the same terminal, in which case, the common terminal 100 corresponds to the first common connecting terminal.

The multiplexer 2 of the second preferred embodiment is different from the multiplexer 1 of the first preferred embodiment in that it includes the transmit/receive filter 16 connected to the node n1 without the inductor 20 interposed therebetween. The multiplexer 2 will be described below mainly by referring to points different from the multiplexer 1 while omitting the same or similar points as those of the first preferred embodiment.

The transmit/receive filter 16 is a fifth acoustic wave filter using the transmit and receive bands of band D (fifth frequency band) as the pass band. The transmit/receive filter 16 is connected to the node n1 without the inductor 20 interposed therebetween. The transmit/receive filter 16 receives an RF transmit signal generated in a transmit circuit (RFIC, for example) via an input/output terminal 96 and outputs the RF transmit signal to the node n1. The transmit/receive filter 16 also receives an RF received signal input from the common terminal 100 and outputs it to the input/output terminal 96. As band D, for example, LTE Band 41 (transmit and receive bands: about 2496 MHz to about 2690 MHz) is preferably used.

Among band A, the transmit band of band B, the receive band of band B, the transmit band of band C, the receive band of band C, and band D, the frequency range of band A and that of band D are adjacent to each other.

That is, band A and band D are close to each other. This may reduce the return loss (increase the reflection coefficient) corresponding to the impedance of the combined circuit of the transmit filters 12 and 14 and the receive filters 13 and 15 seen by the node n1 within the frequency range including band A and band D. Additionally, unlike this combined circuit connected to the node n2, the transmit/receive filter 16 is not connected to the other end of the inductor 20, and the insertion loss of the transmit/receive filter 16 is able to be reduced. It is thus possible to provide a small-size and small-loss multiplexer 2.

Third Preferred Embodiment

In a third preferred embodiment of the present invention, a description will be provided of the circuit configuration of a multiplexer that minimizes a decrease in the receiver sensitivity caused by intermodulation (IM) distortion produced by transmit signals.

Figure 13B:
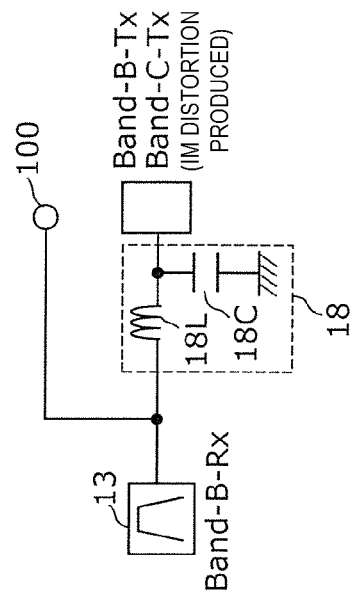
FIGS. 13A and 13B are respectively a circuit diagram and an equivalent circuit diagram of a multiplexer according to a third preferred embodiment of the present invention.
Figure 13A:
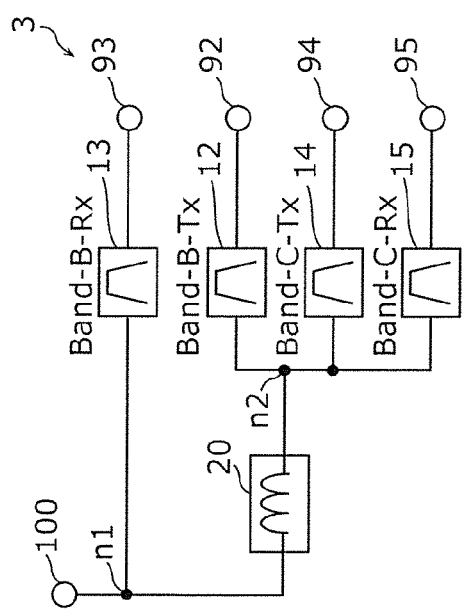
Figure 13C:
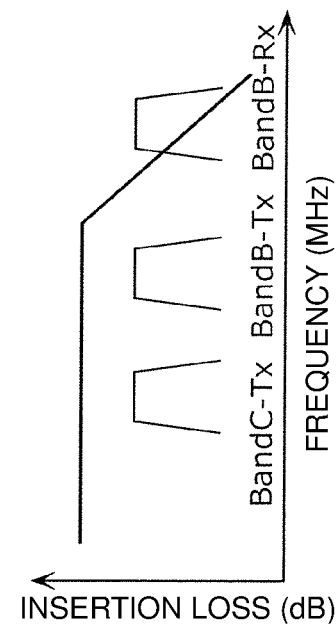
FIG. 13C is a graph illustrating the bandpass characteristics of the multiplexer according to the third preferred embodiment of the present invention.

FIG. 13A is a circuit diagram of a multiplexer 3 according to the third preferred embodiment. FIG. 13B is an equivalent circuit diagram of the multiplexer 3. FIG. 13C is a graph illustrating the bandpass characteristics of the multiplexer 3. As shown in FIG. 13A, the multiplexer 3 includes transmit filters 12 and 14, receive filters 13 and 15, an inductor 20, and a common terminal 100. The multiplexer 3 also includes a node n1 (first common connecting terminal) disposed on a path connecting the common terminal 100 and one end of the inductor 20 and a node n2 (second common connecting terminal) disposed on a path connecting the transmit filters 12 and 14 and the receive filter 15 and the other end of the inductor 20. The common terminal 100 and the node n1 may be the same terminal, in which case, the common terminal 100 corresponds to the first common connecting terminal.

The multiplexer 3 is different from the multiplexer 1 of the first preferred embodiment in the connection configuration of acoustic wave filters of the multiplexer 3. The multiplexer 3 will be described below mainly by referring to points different from the multiplexer 1 while omitting the same or similar points as those of the first preferred embodiment.

The receive filter 13 is a first acoustic wave filter using the receive band of band B (first frequency band) as the pass band. The receive filter 13 is connected to the node n1 without the inductor 20 interposed therebetween. The receive filter 13 receives an RF received signal input from the common terminal 100 and outputs it to an input/output terminal 93. As the receive band of band B, for example, LTE Band 1 (receive band: about 2110 MHz to about 2170 MHz) or LTE Band 66 (receive band: about 2110 MHz to about 2200 MHz) is preferably used.

The transmit filter 12 is a second acoustic wave filter using the transmit band of band B (second frequency band) as the pass band. The transmit filter 12 is connected to the node n2. The transmit filter 12 receives an RF transmit signal generated in a transmit circuit (RFIC, for example) via an input/output terminal 92 and outputs the RF transmit signal to the node n2. As the transmit band of band B, for example, LTE Band 1 (transmit band: about 1920 MHz to about 1980 MHz) is preferably used.

The transmit filter 14 is a third acoustic wave filter using the transmit band of band C (third frequency band) as the pass band. The transmit filter 14 is connected to the node n2. The transmit filter 14 receives an RF transmit signal generated in a transmit circuit (RFIC, for example) via an input/output terminal 94 and outputs the RF transmit signal to the node n2. As the transmit band of band C, for example, LTE Band 3 (transmit band: about 1710 MHz to about 1785 MHz) is preferably used.

The receive filter 15 is a fourth acoustic wave filter using the receive band of band C (fourth frequency band) as the pass band. The receive filter 15 is connected to the node n2. The receive filter 15 receives an RF received signal input from the common terminal 100 and outputs it to an input/output terminal 95. As the receive band of band C, for example, LTE Band 3 (receive band: about 1805 MHz to about 1880 MHz) is preferably used.

Among the receive band of band B (first frequency band), the transmit band of band B (second frequency band), and the transmit band of band C (third frequency band), the receive band of band B is the highest-frequency band.

With the above-described configuration, if an RF transmit signal in the transmit band of band B and an RF transmit signal in the transmit band of band C are transmitted at the same time (2 uplink carrier aggregation (CA)), IM distortion is produced by the RF transmit signal in the transmit band of band B passing through the transmit filter 12 and the RF transmit signal in the transmit band of band C passing through the transmit filter 14. The frequency of this IM distortion overlaps at least a portion of the receive band of band B.

To deal with this issue, in the multiplexer 3 of the third preferred embodiment, as shown in FIG. 13C, the receive filter 15 and the inductor 20 define a low pass filter using the transmit band of band B and the transmit band of band C as the pass band and using the receive band of band B as the attenuation band. More specifically, as shown in FIG. 13B, the receive filter 15 and the inductor 20 define a low pass filter 18 represented by an equivalent circuit including an inductor 18L and a capacitor 18C.

The low pass filter 18 is able to attenuate IM distortion components produced by the RF transmit signal in the transmit band of band B (second frequency band) and that in the transmit band of band C (third frequency band). IM distortion components are thus less likely to be input into the receive filter 13 via the node n1, thus making it possible to reduce or minimize a decrease in the receiver sensitivity caused by IM distortion.

FIG. 14A is a circuit diagram of a multiplexer 4 according to a modified example of the third preferred embodiment. FIG. 14B is an equivalent circuit diagram of the multiplexer 4. FIG. 14C is a graph illustrating the bandpass characteristics of the multiplexer 4. As shown in FIG. 14A, the multiplexer 4 includes transmit filters 12 and 14, receive filters 13 and 15, a transmit/receive filter 17, an inductor 20, and a common terminal 100. The multiplexer 4 also includes a node n1 (first common connecting terminal) disposed on a path connecting the common terminal 100 and one end of the inductor 20 and a node n2 (second common connecting terminal) disposed on a path connecting the transmit filters 12 and 14 and the receive filter 15 and the other end of the inductor 20. The common terminal 100 and the node n1 may be the same terminal, in which case, the common terminal 100 corresponds to the first common connecting terminal.

The multiplexer 4 of the modified example is different from the multiplexer 3 of the third preferred embodiment in that it includes the transmit/receive filter 17 connected to the node n1 without the inductor 20 interposed therebetween. The multiplexer 4 will be described below mainly by referring to points different from the multiplexer 3 while omitting the same points as those of the third preferred embodiment.

The transmit/receive filter 17 is a fifth acoustic wave filter using the transmit and receive bands of band E (fifth frequency band) as the pass band. The transmit/receive filter 17 is connected to the node n1 without the inductor 20 interposed therebetween. The transmit/receive filter 17 receives an RF transmit signal generated in a transmit circuit (RFIC, for example) via an input/output terminal 97 and outputs the RF transmit signal to the node n1. The transmit/receive filter 17 also receives an RF received signal input from the common terminal 100 and outputs it to the input/output terminal 97. As band E, for example, LTE Band 40 (transmit and receive bands: about 2300 MHz to about 2400 MHz) or LTE Band 41 (transmit and receive bands: about 2496 MHz to about 2690 MHz) is preferably used.

The receive filter 15 is a sixth acoustic wave filter using the receive band of band C (sixth frequency band) as the pass band. The receive filter 15 is connected to the node n2. The receive filter 15 receives an RF received signal input from the common terminal 100 and outputs it to an input/output terminal 95. As the receive band of band C, for example, LTE Band 3 (receive band: about 1805 MHz to about 1880 MHz) or LTE Band 32 (receive band: about 1452 MHz to about 1496 MHz) is preferably used.

Among the receive band of band B (first frequency band), the transmit band of band B (second frequency band), and the transmit band of band C (third frequency band), the receive band of band B is the highest-frequency band.

With the above-described configuration, if an RF transmit signal in the transmit band of band B and an RF transmit signal in the transmit band of band C are transmitted at the same time (2 uplink CA), IM distortion is produced by the RF transmit signal in the transmit band of band B passing through the transmit filter 12 and the RF transmit signal in the transmit band of band C passing through the transmit filter 14. The frequency of the IM distortion overlaps at least a portion of the receive band of band B.

To deal with this issue, in the multiplexer 4 of the present modified example, as shown in FIG. 14C, the receive filter 15, the transmit/receive filter 17, and the inductor 20 define a low pass filter using the transmit band of band B and the transmit band of band C as the pass band and using the receive band of band B as the attenuation band. More specifically, as shown in FIG. 14B, the receive filter 15, the transmit/receive filter 17, and the inductor 20 define a low pass filter 19 represented by an equivalent circuit including an inductor 19L and capacitors 19C1 and 19C2.

The low pass filter 19 is able to attenuate IM distortion components produced by the RF transmit signal in the transmit band of band B (second frequency band) and that in the transmit band of band C (third frequency band). IM distortion components are thus less likely to be input into the receive filter 13 via the node n1, thus making it possible to reduce or minimize a decrease in the receiver sensitivity caused by IM distortion. In the low pass filter 19 of the present modified example, equivalent capacitance components of the transmit/receive filter 17 are included in parallel.

The sharpness of the transition band from the pass band to the attenuation band is thus improved, in comparison with the low pass filter 18 of the third preferred embodiment.

The multiplexers have been described above through illustration of the preferred embodiments and modified examples. However, the present invention is not restricted to the above-described preferred embodiments and modified examples. Modified examples obtained by making various modifications to the above-described preferred embodiments and modified examples by those skilled in the art without departing from the scope and spirit of the present invention are also encompassed in the present invention. Various devices integrating multiplexers according to preferred embodiments and modified examples of the present invention are also encompassed in the present invention.

In the multiplexers according to the above-described preferred embodiments and modified examples, a matching element, such as an inductor or a capacitor, and a switching circuit may be connected between components of a multiplexer. In this case, a wiring inductor defined by wiring to connect the components may be used as an example of the inductor.

Preferred embodiments of the present invention may widely be used in communication devices, such as cellular phones, for example, as a small-loss, multiband- and multimode-support multiplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   first and second common connecting terminals;
   an inductance element connected at one end to the first common connecting terminal and at another end to the second common connecting terminal;
   a first acoustic wave filter connected to the first common connecting terminal without the inductance element interposed therebetween and that uses a first frequency band as a pass band;
   a second acoustic wave filter connected to the second common connecting terminal and that uses a second frequency band as a pass band; and
   a third acoustic wave filter connected to the second common connecting terminal and that uses a third frequency band as a pass band; wherein
   the inductance element is structured such that an impedance of a combined circuit including the second and third acoustic wave filters connected to the second common connecting terminal as viewed from the first common connecting terminal is inductive.

2. The multiplexer according to claim 1, wherein the first frequency band is higher than each of the second and third frequency bands.

3. The multiplexer according to claim 1, wherein
   each of the first, second, and third acoustic wave filters includes at least one of a series arm resonator and a parallel arm resonator, the series arm resonator being an acoustic wave resonator disposed on a path connecting an input terminal and an output terminal, the parallel arm resonator being an acoustic wave resonator connected between the path and a ground; and
   the second common connecting terminal is connected to the series arm resonator among acoustic wave resonators of the second acoustic wave filter and is also connected to the series arm resonator among acoustic wave resonators of the third acoustic wave filter.

4. The multiplexer according to claim 1, further comprising:
a fifth acoustic wave filter connected to the first common connecting terminal without the inductance element interposed therebetween and that uses a fifth frequency band as a pass band; wherein
among the first, second, third, and fifth frequency bands, the first frequency band and the fifth frequency band are adjacent to each other in a frequency range.

5. The multiplexer according to claim 4, further comprising:
a sixth acoustic wave filter connected to the second common connecting terminal and that uses a sixth frequency band as a pass band; wherein
the first acoustic wave filter is a receive filter that uses the first frequency band as a receive band;
the second acoustic wave filter is a transmit filter that uses the second frequency band as a transmit band;
the third acoustic wave filter is a transmit filter that uses the third frequency band as a transmit band;
among the first, second, and third frequency bands, the first frequency band is a highest frequency band;
a frequency of intermodulation distortion produced by a radio-frequency transmit signal of the second frequency band passing through the second acoustic wave filter and a radio-frequency transmit signal of the third frequency band passing through the third acoustic wave filter overlaps at least a portion of the first frequency band; and
the fifth and sixth acoustic wave filters and the inductance element define a low pass filter that uses the second and third frequency bands as a pass band and uses the first frequency band as an attenuation band.

6. The multiplexer according to claim 1, wherein
each of the first, second, and third acoustic wave filters is provided in or on a substrate having piezoelectricity;
each of the first, second, and third acoustic wave filters includes an acoustic wave resonator including an interdigital transducer electrode;
the substrate includes:
a support substrate;
a piezoelectric layer, the interdigital transducer electrode being provided on one surface of the piezoelectric layer; and
an energy trapping layer disposed between the support substrate and the piezoelectric layer to trap acoustic wave energy therein; and
the energy trapping layer includes:
a plurality of layers, an acoustic velocity of bulk waves propagating through each of the plurality of layers being different from an acoustic velocity of bulk waves propagating through another one of the plurality of layers; or
a plurality of layers, an acoustic impedance of each of the plurality of layers being different from an acoustic impedance of another one of the plurality of layers.

7. The multiplexer according to claim 1, further comprising:
a common terminal; wherein
the first common connecting terminal is disposed on a path connecting the common terminal and the one end of the inductance element.

8. The multiplexer according to claim 7, wherein the common terminal is connected to an antenna device.

9. The multiplexer according to claim 1, wherein the inductance element is connected in series between the first and second common connecting terminals.

10. The multiplexer according to claim 1, wherein the inductance element is a chip inductor.

11. The multiplexer according to claim 1, wherein the inductance element is a wiring inductance component.

12. The multiplexer according to claim 1, wherein the first frequency band is from about 2300 MHz to about 2400 MHz.

13. The multiplexer according to claim 1, wherein the second frequency band is from about 1920 MHz to about 1980 MHz.

14. The multiplexer according to claim 1, wherein the third frequency band is from about 1710 MHz to about 1785 MHz.

15. A multiplexer comprising:
first and second common connecting terminals;
an inductance element connected at one end to the first common connecting terminal and at another end to the second common connecting terminal;
a first acoustic wave filter connected to the first common connecting terminal without the inductance element interposed therebetween and that uses a first frequency band as a pass band;
a second acoustic wave filter connected to the second common connecting terminal and that uses a second frequency band as a pass band; and
a third acoustic wave filter connected to the second common connecting terminal and that uses a third frequency band as a pass band; wherein
wiring that connects the first common connecting terminal and the first acoustic wave filter is shorter than wiring that connects the first common connecting terminal and the inductance element.

16. A multiplexer comprising:
first and second common connecting terminals;
an inductance element connected at one end to the first common connecting terminal and at another end to the second common connecting terminal;
a first acoustic wave filter connected to the first common connecting terminal without the inductance element interposed therebetween and that uses a first frequency band as a pass band;
a second acoustic wave filter connected to the second common connecting terminal and that uses a second frequency band as a pass band;
a third acoustic wave filter connected to the second common connecting terminal and that uses a third frequency band as a pass band; and
a fourth acoustic wave filter connected to the second common connecting terminal and that uses a fourth frequency band as a pass band; wherein
the first acoustic wave filter is a receive filter that uses the first frequency band as a receive band;
the second acoustic wave filter is a transmit filter that uses the second frequency band as a transmit band;
the third acoustic wave filter is a transmit filter that uses the third frequency band as a transmit band;
among the first, second, and third frequency bands, the first frequency band is a highest frequency band;
a frequency of intermodulation distortion produced by a radio-frequency transmit signal of the second frequency band passing through the second acoustic wave filter and a radio-frequency transmit signal of the third frequency band passing through the third acoustic wave filter overlaps at least a portion of the first frequency band; and the fourth acoustic wave filter and the inductance element define a low pass filter that uses the second and third frequency bands as a pass band and uses the first frequency band as an attenuation band.

17. A multiplexer comprising:

first and second common connecting terminals;

an inductance element connected at one end to the first common connecting terminal and at another end to the second common connecting terminal;

a first acoustic wave filter connected to the first common connecting terminal without the inductance element interposed therebetween and that uses a first frequency band as a pass band;

a second acoustic wave filter connected to the second common connecting terminal and that uses a second frequency band as a pass band; and a third acoustic wave filter connected to the second common connecting terminal and that uses a third frequency band as a pass band; wherein each of the first, second, and third acoustic wave filters includes at least one of a series arm resonator and a parallel arm resonator, the series arm resonator being an acoustic wave resonator disposed on a path connecting an input terminal and an output terminal, the parallel arm resonator being an acoustic wave resonator connected between the path and a ground;

a return loss of the second acoustic wave filter seen by the second common connecting terminal in the first frequency band is greater than a return loss of the third acoustic wave filter seen by the second common connecting terminal in the first frequency band; and the second common connecting terminal is connected to the series arm resonator among acoustic wave resonators of the second acoustic wave filter.

18. The multiplexer according to claim 17, wherein at least one of the first, second, and third acoustic wave filters includes a plurality of the series arm resonators including the at least one series arm resonator and a plurality of the parallel arm resonators including the at least one parallel arm resonator.

19. The multiplexer according to claim 18, wherein the plurality of the series arm resonators and the plurality of parallel arm resonators define a ladder band pass filter.

20. The multiplexer according to claim 17, wherein at least one of the first, second, and third acoustic wave filters includes a longitudinally coupled filter.

* * * * *